United States Patent
Sankaragomathi et al.

(10) Patent No.: US 12,413,242 B2
(45) Date of Patent: Sep. 9, 2025

(54) RECONFIGURABLE ANALOG-TO-DIGITAL CONVERTER

(71) Applicant: Google LLC, Mountain View, CA (US)

(72) Inventors: Kannan Aryaperumal Sankaragomathi, Waterloo (CA); Johan Peter Vanderhaegen, Cupertino, CA (US)

(73) Assignee: Google LLC, Mountain View, CA (US)

( * ) Notice: Subject to any disclaimer, the term of this patent is extended or adjusted under 35 U.S.C. 154(b) by 184 days.

(21) Appl. No.: 18/254,204

(22) PCT Filed: Dec. 21, 2020

(86) PCT No.: PCT/US2020/066407
§ 371 (c)(1),
(2) Date: May 24, 2023

(87) PCT Pub. No.: WO2022/139791
PCT Pub. Date: Jun. 30, 2022

(65) Prior Publication Data
US 2024/0007127 A1 Jan. 4, 2024

(51) Int. Cl.
*H03M 1/12* (2006.01)
*H03M 1/08* (2006.01)
(Continued)

(52) U.S. Cl.
CPC ......... *H03M 3/426* (2013.01); *H03M 1/0854* (2013.01); *H03M 1/16* (2013.01); *H03M 3/498* (2013.01)

(58) Field of Classification Search
CPC ...... H03M 1/1071; H03M 1/12; H03M 1/124; H03M 1/1265; H03M 1/164; H03M 1/38;
(Continued)

(56) References Cited

U.S. PATENT DOCUMENTS 6,249,236 B1 * 6/2001 Lee .................... H03M 3/32
341/172
8,581,761 B1 * 11/2013 Bahukhandi ........ H03M 1/0863
341/118

(Continued)

FOREIGN PATENT DOCUMENTS

WO 2022139791 6/2022

OTHER PUBLICATIONS

"International Search Report and Written Opinion", Application No. PCT/US2020/066407, Sep. 9, 2021, 17 pages.
(Continued)

*Primary Examiner* — Linh V Nguyen
(74) *Attorney, Agent, or Firm* — Colby Nipper PLLC

(57) ABSTRACT

This disclosure describes apparatuses, methods, and techniques that enable a computing device to support a dynamic range of audio quality, varying bandwidths, varying sampling rates, numerous effective number of bits (ENOBs) resolutions, conserve power during an overall usage of the computing device, and enhance a user experience. To do so, the computing device utilizes a reconfigurable analog-to-digital converter (ADC). The reconfigurable ADC includes a successive-approximation-register (SAR) ADC, a noise-canceling circuit, and a noise-shaping circuit. The reconfigurable ADC can selectively operate in different modes of operation, in part, by enabling or disabling the noise-canceling circuit and the noise-shaping circuit.

20 Claims, 8 Drawing Sheets

(51) Int. Cl.
*H03M 1/16* (2006.01)
*H03M 3/00* (2006.01)

(58) Field of Classification Search
CPC ........ H03M 1/502; H03M 1/785; H03M 3/39;
H03M 3/412; H03M 3/414; H03M 3/436;
H03M 3/46; H03M 3/47; H03M 7/3042;
H03M 1/00; H03M 1/008; H03M 1/02;
H03M 1/04; H03M 1/0604; H03M
1/0617; H03M 1/0673; H03M 1/0682;
H03M 1/0809; H03M 1/0845; H03M
1/0863; H03M 1/1004; H03M 1/1057;
H03M 1/1061; H03M 1/1205; H03M
1/122; H03M 1/1245; H03M 1/14; H03M
1/145; H03M 1/56; H03M 1/687; H03M
3/30; H03M 3/32; H03M 3/38; H03M
3/398; H03M 3/424; H03M 3/43; H03M
3/446; H03M 3/45; H03M 3/454; H03M
3/456; H03M 3/464; H03M 3/494; H03M
7/3028; H03M 7/3035; H03M 7/304
USPC .......................... 341/118–120, 144, 155, 172
See application file for complete search history.

(56) References Cited

U.S. PATENT DOCUMENTS

| | | | |
|---|---|---|---|
| 9,160,359 B2 * | 10/2015 | Shiraishi | H03M 1/18 |
| 9,197,240 B1 * | 11/2015 | Kinyua | H03M 1/0626 |
| 9,451,358 B2 | 9/2016 | Sridharan et al. | |
| 9,483,028 B1 * | 11/2016 | Kinyua | H03M 1/124 |
| 9,698,805 B1 * | 7/2017 | Bandyopadhyay | H03M 1/0626 |
| 9,864,822 B2 * | 1/2018 | Schaer | G06F 30/20 |
| 10,070,223 B2 | 9/2018 | Lesso et al. | |
| 10,284,213 B2 * | 5/2019 | Bandyopadhyay | H03M 1/0854 |
| 10,340,932 B2 * | 7/2019 | Bandyopadhyay | H03M 3/426 |
| 11,424,754 B1 * | 8/2022 | Berens | H03M 1/1057 |
| 12,206,430 B2 * | 1/2025 | Obata | H03M 1/468 |
| 2016/0149586 A1 * | 5/2016 | Roh | G06G 7/184 327/337 |
| 2017/0012636 A1 * | 1/2017 | Venca | H03M 1/38 |
| 2017/0126239 A1 | 5/2017 | Sun et al. | |
| 2018/0083647 A1 * | 3/2018 | Yoshioka | H03M 1/466 |
| 2018/0183455 A1 | 6/2018 | Lee et al. | |
| 2020/0162099 A1 | 5/2020 | Perrott | |

OTHER PUBLICATIONS

"Invitation to Pay Additional Fees and Partial Search Report", Application No. PCT/US2020/066407, Sep. 2, 2021, 25 pages.

Bos, et al., "An 8-11b 320kS/s Resolution Scalable Noise Shaping SAR ADC", Jun. 25, 2017, 4 pages.

Chen, et al., "A 9.35-ENOB, 14.8 fJ/conv.- step Fully-Passive Noise-Shaping SAR ADC", Jun. 2015, 2 pages.

Fredenburg, et al., "A 90MS/s 11MHz Bandwidth 62dB SNDR Noise-Shaping SAR ADC", Feb. 19, 2012, 4 pages.

Fredenburg, et al., "A 90-MS/s 11-MHz-Bandwidth 62-dB SNDR Noise-Shaping SAR ADC", Dec. 2012, pp. 2898-2904.

Liu, et al., "16.5 A 13b 0.005mm2 40MS/s SAR ADC with kT/C Noise Cancellation", Sep. 2020, 3 pages.

Liu, et al., "A 13-bit 0.005-mm2 40-MS/s SAR ADC With kT/C Noise Cancellation", Dec. 2020, pp. 3260-3270.

"International Preliminary Report on Patentability", Application No. PCT/US2020/066407, Jun. 13, 2023, 13 pages.

* cited by examiner

400

402
Performing a first cycle of an N-bit analog-to-digital conversion of an analog input voltage by utilizing a SAR ADC

404
Responsive to the performing, generating an N-bit digital output, and the N-bit analog-to-digital conversion including a conversion noise and a residual voltage

406
Amplifying a difference in the analog input voltage between two close time intervals by utilizing a preamplifier with a gain A

408
Sampling, after amplifying the difference in the analog input voltage between two close time intervals, the analog input voltage, by utilizing a noise-canceling circuit

RECONFIGURABLE ANALOG-TO-DIGITAL CONVERTER

RELATED APPLICATION(S)

This application is a national stage entry of International Application No. PCT/US2020/066407, filed Dec. 21, 2020, the disclosure of which is incorporated herein by reference in its entirety.

BACKGROUND

Computing devices (e.g., smartphones) may provide services relating to communication, social interaction, productivity, finances, security, safety, entertainment, transportation, and so forth. To provide these services, a computing device may depend, at least partly, on sensors embedded in or on the computing device. The sensors of the computing device may include microphones, pressure sensors, accelerometers, gyroscopes, ambient-light sensors, magnetometers, proximity sensors, thermometers, barometers, and the like. These sensors may also include interface circuits that require power to operate. For example, the microphone may include microelectromechanical systems (MEMS) to translate acoustic pressure changes to a change in capacitance and then translate the change in capacitance to a change in voltage or a digital code. To this end, the interface circuit of the microphone may include an analog-to-digital converter (ADC).

Given that human hearing ranges from twenty Hertz (20 Hz) to (20 kHz), a good-quality microphone requires supporting a bandwidth approximately equal to 20 kHz and an ADC with a resolution of approximately eighteen effective number of bits (ENOBs). The user, however, may utilize the microphone of the computing device for services that do not require high-quality audio. For example, the user may use the microphone for keyword spotting, background noise detection, and so forth. There is a direct relation between the quality of audio and the power consumed by the ADC. Additionally, the computing device with the ADC may utilize a battery. Thus, a power-hungry ADC drains the battery faster, adversely affecting the user's experience. Currently, device manufacturers design and build ADCs that either support higher-quality audio while using more power or support lower-quality audio while using less power. For example, a first device manufacturer may utilize a sigma-delta ADC that supports the higher-quality audio while using a considerable amount of power. As another example, a second device manufacturer may utilize a successive-approximation-register (SAR) ADC that supports the lower-quality audio while using less power. It is desirable to have a technological solution for an ADC that can support a dynamic range of audio quality, varying bandwidths, varying sampling rates, numerous ENOB resolutions, conserve power during an overall usage of the computing device, and enhance a user's experience.

SUMMARY

This disclosure describes apparatuses, methods, and techniques that enable a computing device to support a dynamic range of audio quality, varying bandwidths, varying sampling rates, numerous effective number of bits (ENOBs) resolutions, conserve power during an overall usage of the computing device, and enhance a user experience. To do so, the computing device utilizes a reconfigurable analog-to-digital converter (ADC). The reconfigurable ADC includes a successive-approximation-register (SAR) ADC, a noise-canceling circuit, and a noise-shaping circuit. The reconfigurable ADC can selectively operate in different modes of operation, in part, by enabling or disabling the noise-canceling circuit and the noise-shaping circuit.

In one aspect, the disclosure describes an apparatus being a reconfigurable ADC. The reconfigurable ADC is configured to selectively support at least two different resolution settings. The reconfigurable ADC includes a SAR ADC, which is configured to perform a first cycle of an N-bit analog-to-digital conversion of an analog input voltage to generate an N-bit digital output. Unfortunately, as with all ADCs, the N bit analog-to-digital conversion also includes conversion noise and a residual voltage after the first cycle of the N-bit analog-to-digital conversion. Then, reconfigurable ADC utilizes the SAR ADC to amplify a difference in the analog input voltage between two close time intervals. After amplifying the difference in the analog input voltage, the reconfigurable ADC utilizes a noise-canceling circuit. The noise-canceling circuit enables the reconfigurable ADC to lower the conversion noise by sampling the analog input voltage after the amplification of the difference in the analog input voltage. Lastly, the reconfigurable ADC utilizes a noise-shaping circuit. The noise-shaping circuit enables the reconfigurable ADC to add or subtract the residual voltage from the first cycle to a second cycle of the N-bit analog to digital conversion to reduce a quantization noise. In addition, the reconfigurable ADC can weight residual voltages from several previous analog-to-digital conversion cycles and feed them to a new analog-to-digital conversion cycle, further reducing the quantization noise.

In another aspect, the disclosure describes a method. The method includes performing a first cycle of an N-bit analog-to-digital conversion of an analog input voltage by utilizing a SAR ADC. The method then includes generating an N-bit digital output. Unfortunately, as with all ADCs, the N-bit analog-to-digital conversion includes conversion noise and a residual voltage. Then, the method includes amplifying a difference in the analog input voltage between two close time intervals by utilizing a preamplifier with a gain A. After amplifying the difference in the analog input voltage between two close time intervals, the method includes sampling by utilizing a noise-canceling circuit. This enables the method to lower the conversion noise, because the conversion noise is inversely related to a mathematical squaring of the gain A. As a result, the method includes increasing a first resolution of the first cycle of the N-bit analog-to-digital conversion. The method also includes adding or subtracting the residual voltage from the first cycle to a second cycle of the N-bit analog-to-digital conversion by utilizing a noise-shaping circuit. Adding or subtracting the residual voltage from the first cycle to the second cycle enables the method to increase a second resolution of the second cycle of the N-bit analog-to-digital conversion. In addition, the method can weight residual voltages from several previous analog-to-digital conversion cycles and feed them to the new analog-to-digital conversion cycle. The method is an iterative process.

In another aspect, the disclosure describes a system. The system includes at least one processor, at least one sensor, and at least one sensor interface circuit. The at least one sensor interface circuit includes at least one reconfigurable amplifier and a reconfigurable ADC. The reconfigurable ADC includes a SAR ADC, a noise-canceling circuit, and a noise-shaping circuit. The system also includes at least one computer-readable medium having instructions thereon that, responsive to execution by the at least one processor, performs the operations of the method described above.

This summary describes a reconfigurable ADC, which supports multiple modes of operation. The multiple modes of operation enable the reconfigurable ADC to support varying frequency bandwidths, sampling rates, and/or an effective number of bits (ENOB) resolution depending on a user's needs. For ease of description and the sake of clarity, the disclosure references a reconfigurable ADC of a microphone's interface circuit. The same concepts, however, may be used to design and build a reconfigurable ADC embedded in or on interface circuits of other sensors, for example, pressure sensors, accelerometers, gyroscopes, ambient-light sensors, magnetometers, proximity sensors, thermometers, barometers, or any sensor that can benefit from the reconfigurable ADC supporting similar frequency bandwidths, sampling rates, and/or ENOB resolutions. This summary is not intended to identify exhaustive features of the claimed subject matter, nor is it intended for use in determining the scope of the claimed subject matter.

BRIEF DESCRIPTION OF THE DRAWINGS

This description details one or more aspects of apparatuses, methods, and techniques of a reconfigurable ADC, supporting multiple modes of operation. The same numbers are used throughout the drawings to reference like features and components:

FIG. 3-1 illustrates an example schematic of the reconfigurable ADC operating in the first mode by utilizing a successive-approximation-register (SAR) ADC, a noise-canceling circuit, and a noise-shaping circuit.

FIG. 3-2 illustrates an example operation of the SAR ADC performing a 4-bit conversion and a timing diagram for operating the reconfigurable ADC.

FIG. 3-3 illustrates the example schematic of the reconfigurable ADC operating in the second or the third mode by utilizing the SAR ADC and the noise-canceling circuit.

FIG. 3-4 illustrates the example schematic of the reconfigurable ADC operating in the fourth mode by utilizing the SAR ADC.

FIGS. 4-1 and 4-2 jointly illustrate an example method for performing an N-bit analog-to-digital conversion by utilizing the reconfigurable ADC having the SAR ADC, the noise-canceling circuit, and the noise-shaping circuit.

DETAILED DESCRIPTION

Overview

Computing devices (e.g., smartphones) may provide services relating to communication, social interaction, productivity, finances, security, safety, entertainment, transportation, and so forth. To provide the services, the computing device may depend, at least partly, on sensors (e.g., microphone) embedded in or on the computing device. A good-quality microphone requires supporting a large bandwidth (e.g., twenty thousand Hertz, 20 kHz) during an analog-to-digital conversion. To this end, a device manufacturer may utilize an analog-to-digital converter (ADC) with a high resolution (e.g., eighteen effective number of bits). Currently, device manufacturers design and build ADCs that either support higher-quality audio while using more power or support lower-quality audio while using less power. For example, a first device manufacturer may utilize a sigma-delta ADC that supports the higher-quality audio while using a considerable amount of power. As another example, a second device manufacturer may utilize a successive-approximation-register (SAR) ADC that supports the lower-quality audio while using less power. A user, however, may utilize the microphone of the computing device for services that require higher-quality audio and service that require lower-quality audio. Using a high-quality microphone for services that require lower-quality audio, unnecessarily consumes more power. As a result, the computing device may drain a battery faster, adversely affecting a user experience.

To this end, this disclosure describes a reconfigurable analog-to-digital converter (ADC). The reconfigurable ADC includes a successive-approximation-register (SAR) ADC, a noise-canceling circuit, and a noise-shaping circuit. The reconfigurable ADC can selectively operate in different modes of operation, in part, by enabling or disabling the noise-canceling circuit and the noise-shaping circuit. The different modes of operation enable the reconfigurable ADC to support a dynamic range of audio quality, varying bandwidths, varying sampling rates, numerous ENOB resolutions, conserve power during an overall usage of the computing device, and enhance the user experience.

Example Environments

Figure 1:
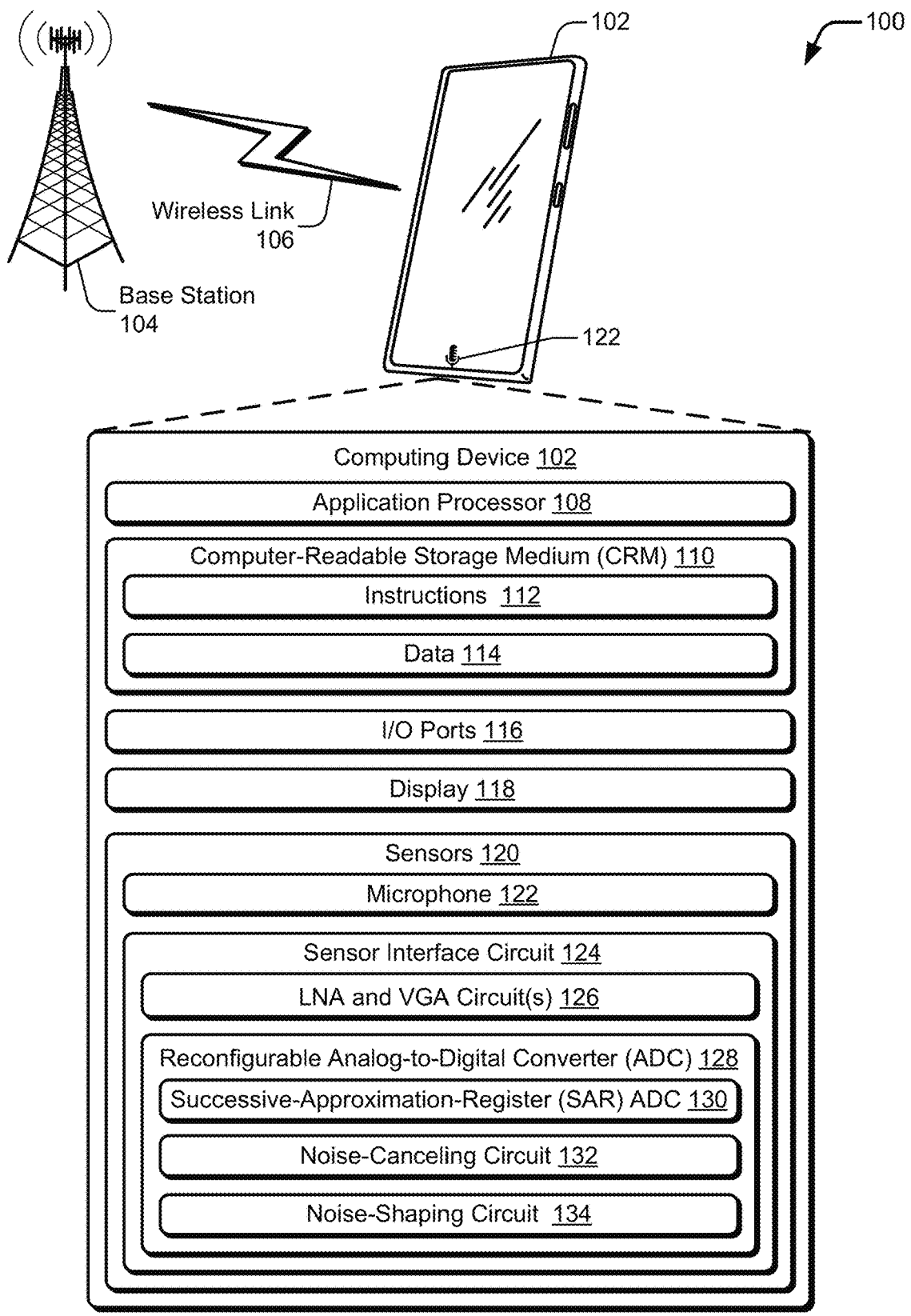
FIG. 1 illustrates an example environment that includes a computing device equipped with at least one sensor having an associated sensor interface circuit; the sensor interface circuit includes a reconfigurable amplifier and a reconfigurable analog-to-digital converter (ADC).

FIG. 1 illustrates an example environment 100, which includes a computing device 102. FIG. 1 illustrates the computing device 102 as being a smartphone. The computing device 102, however, may be any computing device, for example, a medical device (e.g., hearing aids), a wearable device (e.g., wireless headphones, watches, eyeglasses, clothing), a smart-home voice-assistant device, a cellular base station, a broadband router, an access point, a gaming device, a navigation device, a media device, a laptop computer, a desktop computer, a tablet computer, a computer server, a smart appliance, a vehicle-based communication system, an internet-of-things (IoT) device, a standalone sensor, a security device, an asset tracker, a fitness management device, and so forth.

The computing device 102 may communicate with a base station 104 using a wireless link 106, which may be implemented as any suitable type of wireless link that carries a communication signal. The computing device 102 may include a wireless interface device (not illustrated) to facilitate communication over any suitable type of wireless network, including a wireless local-area-network (WLAN), a wireless personal-area-network (WPAN) (e.g., Bluetooth®), a peer-to-peer (P2P) network, a mesh network, a cellular network, a wireless wide-area-network (WWAN), or a Global Navigation Satellite System (GNSS) (e.g., Galileo, Global Positioning System (GPS), Quasi-Zenith Satellite System (QZSS), BeiDou, GLObal NAvigation Satellite System (GLONASS), and so forth). Alternatively or additionally, the computing device 102 may include a wired interface device (not illustrated), for example, an Ethernet or fiber optic transceiver for communicating over a wired local area network (LAN), an intranet, or the Internet. Hence, the computing device 102 may communicate with the base station 104 or another device using a wired connection, a wireless connection, or a combination thereof.

The computing device 102 includes at least one application processor 108, and at least one computer-readable storage medium 110 (CRM 110). The application processor 108 may include any type of processor, for example, a central processing unit (CPU) or a multi-core processor that is configured to execute processor-executable instructions (e.g., code) stored by the CRM 110. The CRM 110 may include any suitable type of data storage media, for example, volatile memory and/or non-volatile memory. In the context of this disclosure, the CRM 110 is implemented to store instructions 112, data 114, and other information of the computing device 102. Thus, the CRM 110 does not include transitory propagating signals or carrier waves.

The computing device 102 may also include one or more input/output ports 116 (I/O ports 116) and/or at least one display 118 that may present graphical images provided by the computing device 102 and may aid a user to interact with the computing device 102. The display 118 can be realized as a display screen or a projection that presents graphical images provided by the computing device 102, for example, a user interface associated with an operating system (OS), program, or application. Alternatively or additionally, the display 118 may be implemented as a display port of the I/O ports 116 or virtual interface through which the computing device 102 may communicate or present graphical content to a user.

Further, the computing device 102 includes sensors 120. The sensors 120 include a microphone 122 and may include other sensors that are not illustrated in FIG. 1 (e.g., pressure sensors, accelerometers, gyroscopes, ambient-light sensors, magnetometers, proximity sensors, thermometers, barometers, and so forth). The sensor 120 (e.g., the microphone 122) includes an associated sensor interface circuit 124 (interface circuit 124). The microphone 122 and the interface circuit 124 can operate in different modes to support a range of audio qualities, depending on the user's needs, an application (e.g., phone call, background-noise detection), or a combination thereof. For example, when the user is speaking or singing into the microphone 122, the microphone and the interface circuit 124 produce higher-quality audio while using adequate power to generate the needed higher-quality audio. As another example, the computing device 102 may utilize the microphone 122 and the interface circuit 124 to detect a keyword or phrase (e.g., "Hey OS"). For such operations, the computing device 102 can utilize lower-quality audio while using less power.

The interface circuit 124 utilizes at least one reconfigurable amplifier that may include a low-noise amplifier and a variable-gain amplifier (illustrated as LNA and VGA circuit (s) 126). Further, the interface circuit 124 includes a reconfigurable analog-to-digital converter 128 (reconfigurable ADC 128), which can operate in different modes of operation. The reconfigurable ADC 128 includes a successive-approximation-register analog-to-digital converter 130 (SAR ADC 130). The SAR ADC 130 can operate using less power than an ADC with high "overhead" power demand (e.g., a sigma-delta ADC). Existing SAR ADCs, however, do not support high ENOB resolutions and often cannot support the higher-quality audio supported by the sigma-delta ADCs. To this end, the reconfigurable ADC 128 also includes a noise-canceling circuit 132 and a noise-shaping circuit 134 to achieve high ENOB resolutions, where the ENOB resolutions may be measured and/or calculated using Equation 1:

$$ENOB = \frac{SNDR(dB) - 1.76}{6.02} \quad \text{Equation 1}$$

where ENOB denotes an effective number of bits and SNDR (dB) denotes a signal-to-noise and distortion ratio measured and/or calculated in decibels.

The SAR ADC 130, the noise-canceling circuit 132, and the noise-shaping circuit 134 enable the reconfigurable ADC 128 to support a range of ENOB resolutions (e.g., approximately six to approximately eighteen ENOBs), as it is further described below. Note that there is a direct relationship between the ENOB resolution supported by an ADC and the audio quality. Each additional bit of the ENOB resolution approximately quadruples the quality of audio. For example, an ADC that supports an eighteen-ENOB resolution may produce an audio quality 1024 times better than an ADC that supports a thirteen-ENOB resolution. Further, there is a direct relationship between the audio quality and the power consumed by an ADC. To conserve power and battery life during an overall usage of the computing device 102, the reconfigurable ADC 128 can support a dynamic range of audio quality, varying frequency bandwidths, varying sampling rates, and numerous ENOB resolutions.

Figure 2:
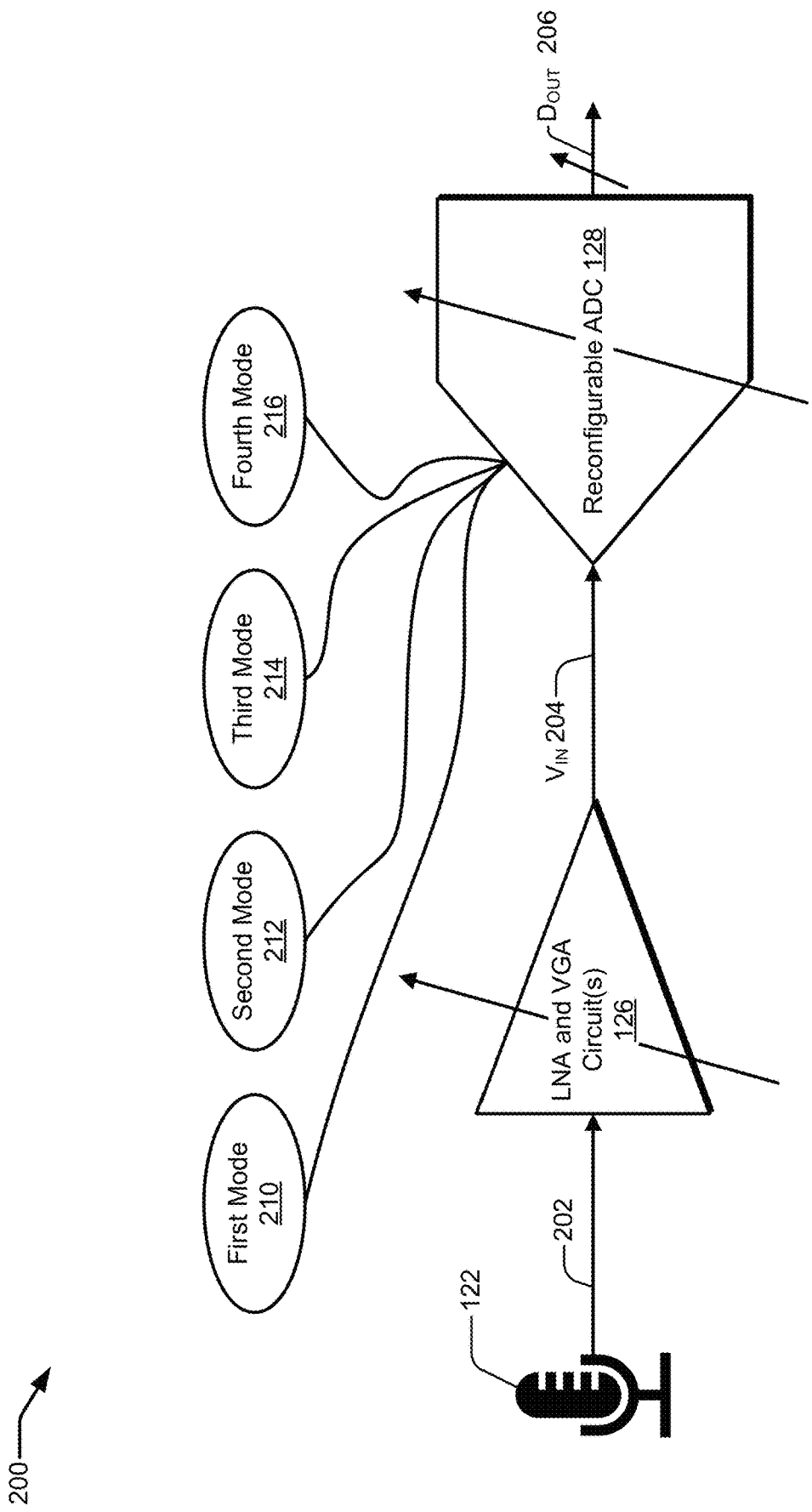
FIG. 2 illustrates an example environment of a microphone, where the microphone utilizes the sensor interface circuit; the sensor interface circuit includes the reconfigurable amplifier and the reconfigurable ADC, and where the reconfigurable ADC can operate in at least a first, a second, a third, and a fourth mode of operation.

FIG. 2 illustrates an example environment 200 of the microphone 122. The microphone 122 includes a transducer (not illustrated), which may include microelectromechanical systems (MEMS) to translate a change in acoustic pressure into a change in capacitance and then translate the change in capacitance into a change in a voltage 202. The interface circuit 124 utilizes the LNA and VGA circuits 126 to amplify the change in the voltage 202 to produce an input voltage 204 ($V_{IN}$ 204) to the reconfigurable ADC 128. The reconfigurable ADC 128 generates a digital output 206 ($D_{OUT}$ 206), for example, a 10-bit $D_{OUT}$ 206. The reconfigurable ADC 128 can operate in at least four modes of operation: a first mode 210, a second mode 212, a third mode 214, and fourth mode 216. The modes 210 to 216 enable the reconfigurable ADC 128 to conserve power and battery life during the overall usage of the computing device 102. Specifically, the modes 210 to 216 enable the reconfigurable ADC 128 to support the dynamic range of audio quality, the many frequency bandwidths, the varying sampling rates, and the numerous ENOB resolutions, as is further described below. The LNA and VGA circuits 126 and the reconfigurable ADC 128 of the interface circuit 124 may be implemented as separate circuits, as a single circuit, as a system-on-chip (SoC), or a combination thereof. Also, the interface circuit 124 may be embedded in the microphone 122 or separate from the microphone 122.

Reconfigurable ADC

Figures 1, 3:
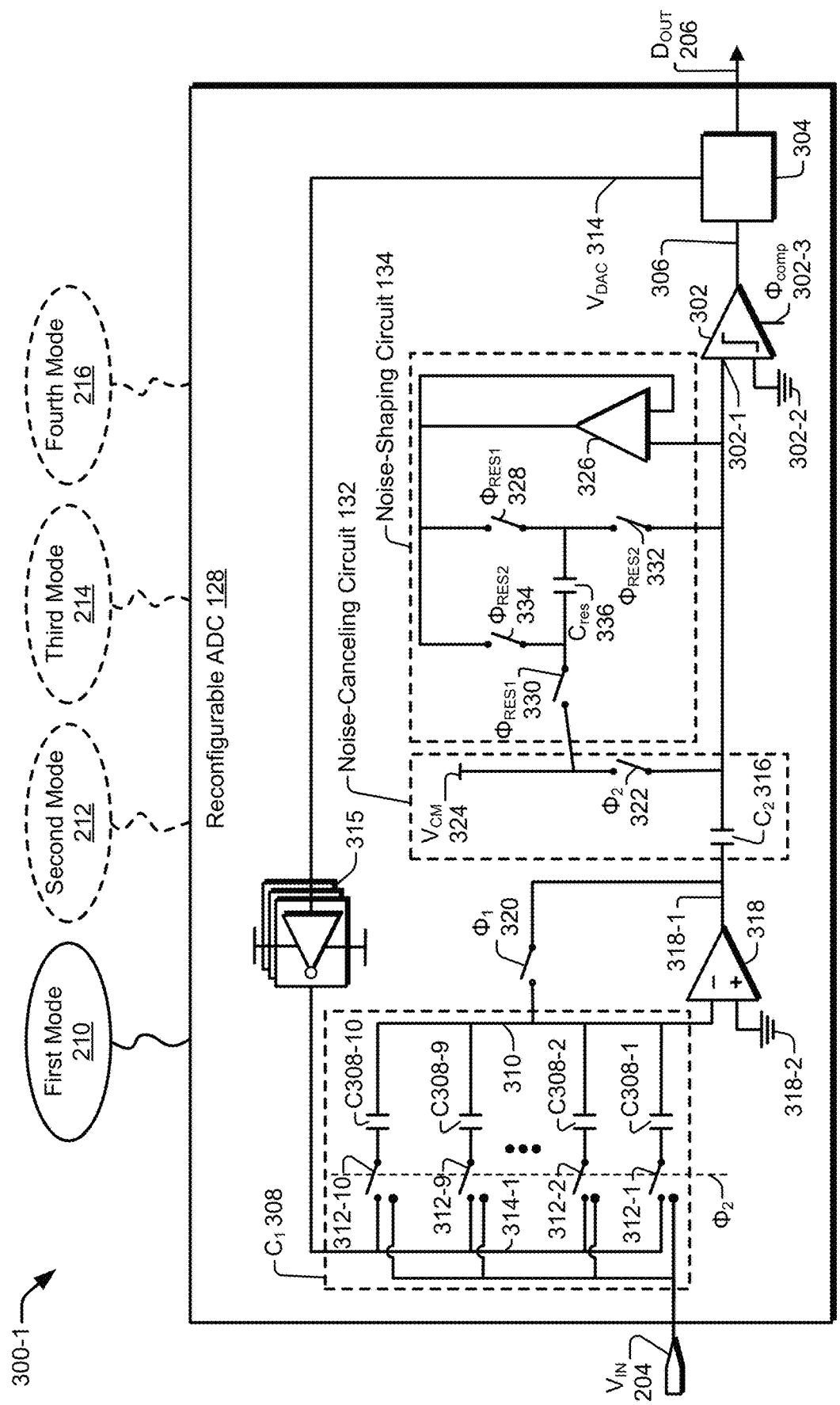
Figure 3:
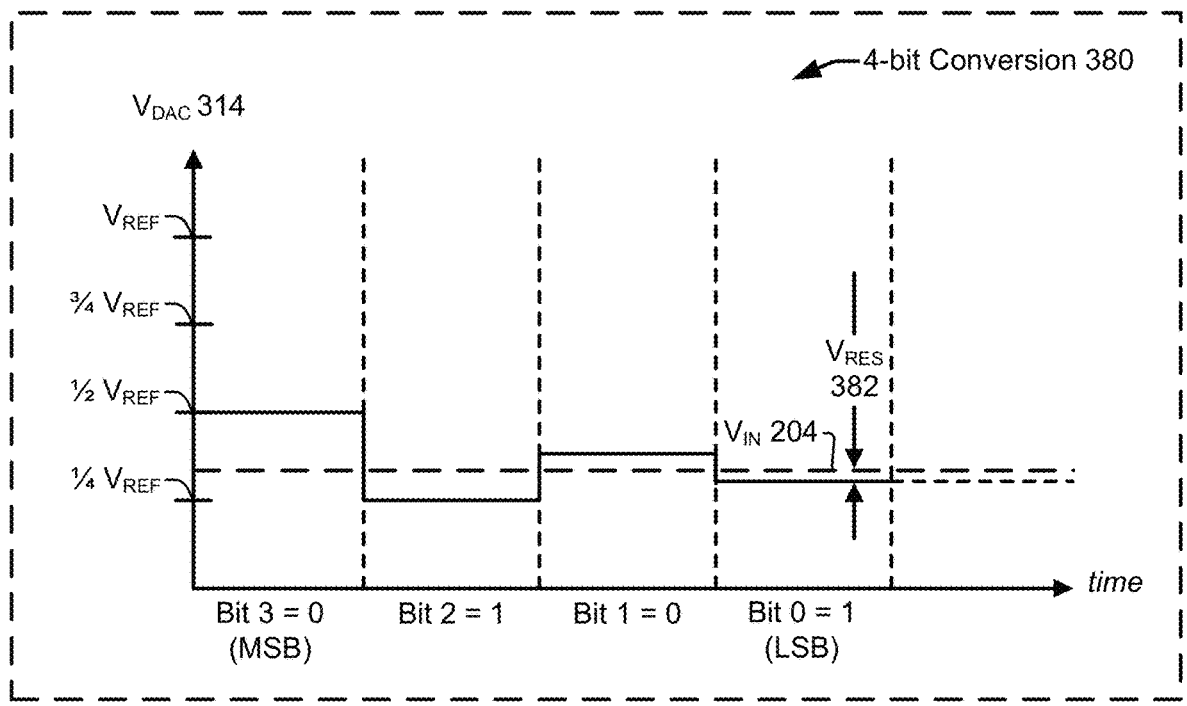
Figure 2:
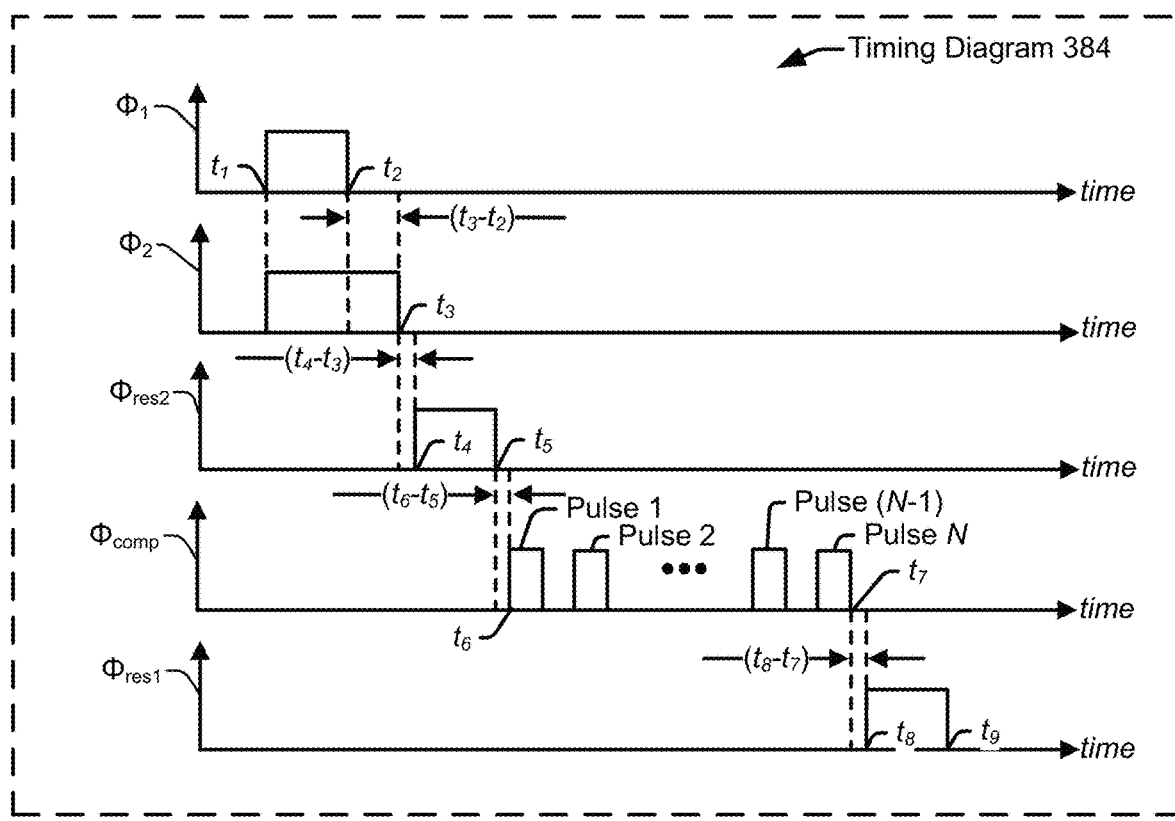
Figure 3:
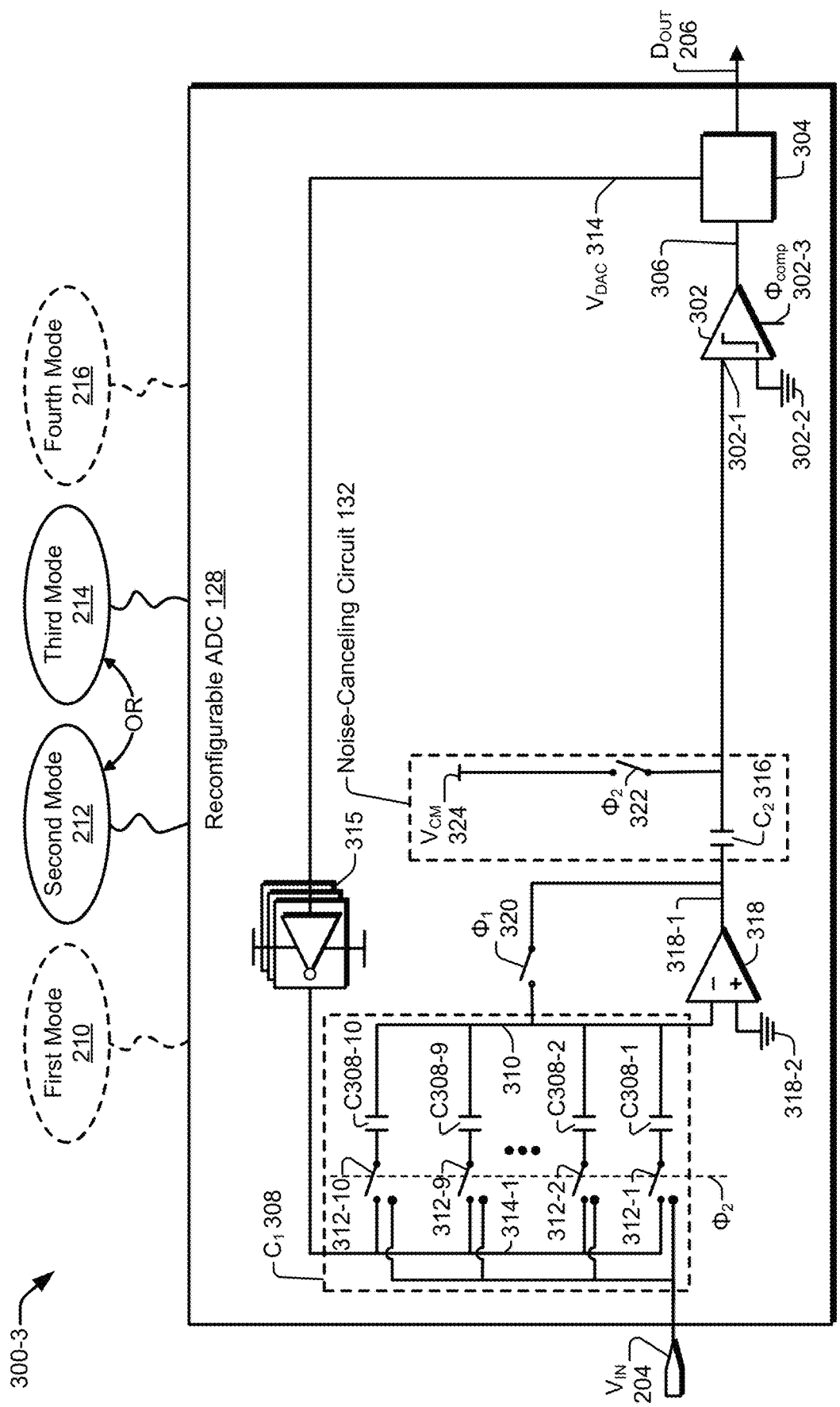

FIG. 3-1 illustrates an example schematic 300-1 of the reconfigurable ADC 128. For ease of description and the sake of clarity, the example schematic 300-1 depicts a single-ended reconfigurable ADC 128. It is to be understood that a computing device manufacturer may use the same concepts and techniques to design and build a differential reconfigurable ADC. In the example schematic 300-1, the SAR ADC 130, the noise-canceling circuit 132, and the noise-shaping circuit 134 are coupled to create the reconfigurable ADC 128. Existing SAR ADCs support lower ENOB resolutions than existing sigma-delta ADCs. The sigma-delta ADC, however, consumes a considerable amount of power, and the power consumption does not scale well with a sampling rate. Although the sigma-delta ADC can produce higher-quality audio by supporting higher ENOB resolutions than the existing SAR ADC, the considerable "overhead" power required to operate the sigma-delta ADC limits conservation of power during the overall usage of a computing device. On the other hand, the SAR ADC 130 consumes less power, and the power consumption scales approximately linearly with a sampling rate of the SAR ADC 130. Thus, as the reconfigurable ADC 128 operates in the different modes 210 to 216, the SAR ADC 130 enables conservation of power and battery life during the overall usage of the computing device 102.

In general, SAR ADCs can perform an N-bit conversion of the input voltage 204 ($V_{IN}$ 204) to generate an N-bit digital output 206 ($D_{OUT}$ 206) in N (e.g., four, eight, ten, twelve) comparison periods. This description centers on the SAR ADC 130 performing a 10-bit conversion (N=10) in ten comparison periods to generate a 10-bit digital output 206 ($D_{OUT}$ 206). The SAR ADC 130 includes a comparator 302 and a logic block 304. Although not explicitly illustrated in detail in FIG. 3-1, the logic block 304 may include a control logic circuit, an associated 10-bit SAR, and a digital-to-analog converter (DAC). The comparator 302 generates a signal 306, and the signal 306 is an input signal to the logic block 304. The logic block 304 generates a DAC output voltage 314 ($V_{DAC}$ 314) and the 10-bit digital output 206 ($D_{OUT}$ 206). The SAR ADC 130 may also include buffers 315. An input to the buffers 315 is the DAC output voltage 314 ($V_{DAC}$ 314), and an output of the buffers 315 is a signal 314-1.

Like some existing SAR ADCs, the SAR ADC 130 places the input voltage 204 ($V_{IN}$ 204) on a sample and/or hold state by utilizing a capacitive DAC (CDAC). The CDAC of the SAR ADC 130 includes a capacitance array $C_1$ 308. In the example schematic 300-1, the capacitance array $C_1$ 308 includes ten (N=10) capacitors C308-1, C308-2, ..., C308-9, and C308-10 with binary weighted values. For example, the capacitance array $C_1$ 308 may include the following capacitors, expressed in femtofarads (fF): C308-1=$2^0$×0.5 fF=0.5 fF; C308-2=$2^1$×(C308-1)=$2^1$×0.5 fF=1 fF; ...; C308-9=$2^8$×(C308-1)=$2^8$×0.5 fF=128 fF; and C308-10=$2^9$×(C308-1)=$2^9$×0.5 fF=256 fF. The capacitors C308-1, C308-2, ..., C308-9, and C308-10 of the capacitance array $C_1$ 308 share a common terminal 310. The common terminal 310 is coupled to a first input terminal 302-1 of the comparator 302, while a second input terminal of the comparator 302 is coupled to a ground node 302-2. The capacitors C308-1, C308-2, ..., C308-9, and C308-10 of the capacitance array $C_1$ 308 utilize switches 312-1, 312-2, ..., 312-9, and 312-10, respectively, to select between the signal 314-1 and the input voltage 204 ($V_{IN}$ 204). By selecting between the signal 314-1 and the input voltage 204 ($V_{IN}$ 204), the capacitance array $C_1$ 308 traps a charge proportional to the input voltage 204 ($V_{IN}$ 204), as it is further described below.

For ease of description and clarity in further explaining an operation of the SAR ADC 130, assume the SAR ADC 130 performs an example 4-bit conversion 380 of FIG. 3-2, instead of the conversion of FIG. 3-1. After placing the input voltage $V_{IN}$ 204 on the sample and/or hold state, the SAR ADC 130 performs a binary search algorithm by setting an associated 4-bit SAR to midscale. As such, initially, the example 4-bit SAR sets a most-significant bit (MSB) to "high" or one (1) and sets the other bits to "low" or zero (0). In FIG. 3-2, bit 3 is the MSB, and bit 0 is a least-significant bit (LSB). When bit 3 is "high" (MSB=bit 3=1), the logic block 304 forces the DAC output voltage 314 ($V_{DAC}$ 314) to half of a reference voltage (½ $V_{REF}$), where $V_{REF}$ is the reference voltage provided to the DAC of the logic block 304. The comparator 302 then determines whether the input voltage 204 ($V_{IN}$ 204) is less or greater than the DAC output voltage 314 ($V_{DAC}$ 314). If the input voltage 204 ($V_{IN}$ 204) is greater than the DAC output voltage 314 ($V_{DAC}$ 314), the control logic of the block 304 sets bit 3 to "high" (MSB=bit 3=1) and bit 2 to "high" (bit 2=1). Conversely, as is illustrated in the example 4-bit conversion 380 in FIG. 3-2, if the input voltage 204 ($V_{IN}$ 204) is less than the DAC output voltage 314 ($V_{DAC}$ 314), the control logic of the block 304 sets bit 3 to "low" (MSB=bit 3=0), and sets bit two to "high" (bit 2=1). The operation of the SAR ADC 130 continues analogously by setting bit 1 to "low" (bit 1=0) and bit 0 to "high" (LSB=bit 0=1), resulting in a residual voltage 382 ($V_{RES}$ 382). The residual voltage 382 ($V_{RES}$ 382) is a difference between the DAC output voltage 314 ($V_{DAC}$ 314) and the input voltage 204 ($V_{IN}$ 204) after an analog-to-digital conversion cycle. Thus, the residual voltage 382 ($V_{RES}$ 382) represents an error in the analog-to-digital conversion cycle. Although the residual voltage 382 ($V_{RES}$ 382) is small compared to the DAC output voltage 314 ($V_{DAC}$ 314) and the input voltage 204 ($V_{IN}$ 204), existing SAR ADCs ignore the residual voltage 382 ($V_{RES}$ 382). Instead, the reconfigurable ADC 128 stores, processes, and adds the voltage 382 ($V_{RES}$ 382) to subsequent conversion cycles to reduce a quantization noise and increase the ENOB resolution, as it is further described below.

As with all ADCs, a C/kT noise limits sampling accuracy during the analog-to-digital conversion cycle, where k denotes the Boltzmann constant, T denotes a period of a sampling time, and C denotes a sampling capacitance. Also, the input voltage 204 ($V_{IN}$ 204) includes a root mean square (RMS) equivalent input-referred voltage noise ($V_{n,IN}$) (not explicitly illustrated in FIG. 3-1). Consequently, the existing SAR ADCs support relatively low ENOB resolutions and cannot produce high-quality audio, even when oversampling the existing SAR ADCs. Existing SAR ADCs typically use a single clock phase by utilizing a switch (not illustrated as such in FIG. 3-1) coupled between the common terminal 310 of the capacitance array $C_1$ 308 and a preamplifier. An output of that preamplifier is an input to the comparator of the existing SAR ADCs. In the existing SAR ADCs, Equation 2 illustrates the RMS equivalent input-referred voltage noise ($V_{n,IN}$) and the C/kT noise driven by the CDAC (e.g., $C_1$ 308).

$$V_{n,IN}^2 = \frac{k \cdot T}{(C_1 310)} \quad \text{Equation 2}$$

The reconfigurable ADC 128, however, in certain modes of operation (e.g., 210), may utilize the noise-canceling circuit 132 to lower the C/kT noise, as is further described below. In part, the noise-canceling circuit 132 utilizes a capacitor $C_2$ 316 coupled between a preamplifier 318 and the comparator 302 of the SAR ADC 130. Note that the capacitor $C_2$ 316 has a considerably smaller value than the entire capacitance array $C_1$ 308. For example, the capacitor $C_2$ 316 may be 0.75 fF. The preamplifier 318 includes a first input, a second input, and an output 318-1. The output signal 318-1 of the preamplifier 318 is coupled to a second terminal of the capacitor $C_2$ 316, while a first terminal of the capacitor $C_2$ 316 is coupled to the comparator 302. As is illustrated in FIG. 3-1, the first input of the preamplifier 318 is coupled to the common terminal 310 of the capacitance array $C_1$ 308, and the second input of the preamplifier 318 is coupled to a ground node 318-2. Note that in a differential, instead of a single-ended, reconfigurable ADC, the second input of the preamplifier 318 is not coupled to the ground node 318-2.

In the first mode 210, the reconfigurable ADC 128 utilizes the SAR ADC 130, the noise-canceling circuit 132, and noise-shaping circuit 134 to support an analog-to-digital conversion of approximately eighteen ENOBs and to produce high-quality audio. As is detailed by the timing diagram 384 in FIG. 3-2 and the example schematic 300-1 of FIG. 3-1, in the first mode 210, the reconfigurable ADC 128 operates in the following phases: a first phase ($\phi_1$), a second phase ($\phi_2$), a comparator phase ($\phi_{COMP}$), a first residual phase ($\phi_{RES1}$), and a second residual phase ($\phi_{RES2}$). At a rising edge of the first phase ($\phi_1$), the reconfigurable ADC 128 closes a switch $\phi_1$ 320 at time $t_1$. At a falling edge of the first phase ($\phi_1$), the reconfigurable ADC 128 opens the switch $\phi_1$ 320 at time $t_2$, where time $t_2$ is greater than time $t_1$. At a rising edge of the second phase ($\phi_2$), the reconfigurable ADC 128 closes a switch $\phi_2$ 322 and at least one of the switches 312-1 to 312-10 at time $t_1$. At a falling edge of the second phase ($\phi_2$), the reconfigurable ADC 128 opens the switch $\phi_2$ 322 and the at least one of the switches 312-1 to 312-10 at time $t_3$, where time $t_3$ is greater than time $t_2$. Note that a first terminal of the switch $\phi_2$ 322 is coupled to a common-mode voltage 324 (Wm 324), and a second terminal of the switch $\phi_2$ 322 is coupled to the first terminal of the capacitor $C_2$ 316. Unlike the existing SAR ADCs, the reconfigurable ADC 128 does not utilize the capacitance array $C_1$ 308 to sample the input voltage ($V_{IN}$ 204), but rather utilizes the capacitance array $C_1$ 308 to hold the input voltage 204 ($V_{IN}$ 204) during the first phase ($\phi_1$). Instead, the reconfigurable ADC 128 samples the input voltage 204 ($V_{IN}$ 204) at the falling edge of the second phase ($\phi_2$). Before the falling edge of the second phase ($\phi_2$), the reconfigurable ADC 128 amplifies a difference in charge held between two close time intervals, $t_3$ and $t_2$, at the capacitance array $C_1$ 308 by using the preamplifier 318 with a gain A (e.g., A=10, A=15, A=20). The reconfigurable ADC 128 then stores the charge at the capacitor $C_2$ 316. Further, the capacitance array $C_1$ 308 keeps a low signal swing at the common terminal 310. Subsequently, the preamplifier 318 does not saturate during a delta time "$t_3$-$t_2$" between the falling edge of the first phase ($\phi_1$) and the falling edge the second phase ($\phi_2$). Note that the preamplifier 318 amplifies the difference in the input voltage 204 ($V_{IN}$ 204) between the delta time "$t_3$-$t_2$" during a same cycle of the N-bit analog-to-digital conversion.

By utilizing the noise-canceling circuit 132, the reconfigurable ADC 128 samples the difference in the input voltage 204 ($V_{IN}$ 204) between the delta time "$t_3$-$t_2$" after the preamplifier 318. Thus, the capacitance array $C_1$ 308 can hold a charge that is considerably lower (e.g., ten-times, fifteen-times, or twenty-times lower) than the existing SAR ADCs to achieve a same ENOB resolution with a lower C/kT noise. Equation 3 illustrates the RMS equivalent input-referred voltage noise ($V_{n,IN}$) and the C/kT noise of the reconfigurable ADC 128 driven by the capacitor $C_2$ 316.

$$V_{n,IN}^2 = \frac{k \cdot T}{A^2 \cdot (C_2 316)} \qquad \text{Equation 3}$$

Assuming a gain of one (A=1), a charge stored in the capacitance array $C_1$ 308 needs to equal a charge stored in the capacitor $C_2$ 316 to achieve a same performance as in the existing SAR ADCs. The reconfigurable ADC 128, however, uses the preamplifier 318, which has a gain considerably larger than one (e.g., A=10, A=15, A=20). Assuming a gain of ten (A=10), the reconfigurable ADC 128 achieves the same performance as the existing SAR ADCs by storing a charge in the capacitance array $C_1$ 308 that is approximately 100 times lower ($A^2 = 10^2 = 100$). Therefore, by utilizing the noise-canceling circuit 132, the reconfigurable ADC 128 operates with a considerably lower C/kT noise compared to the existing SAR ADCs for the same charge stored in the CDAC (e.g., $C_1$ 308). As such, the noise-canceling circuit 132 enables the reconfigurable ADC 128 to achieve a higher ENOB resolution.

In the first mode 210, to further increase the ENOB resolution similar to the sigma-delta ADC, for example, to approximately eighteen ENOBs, the reconfigurable ADC 128 also utilizes the noise-shaping circuit 134, in addition to the noise-canceling circuit 132. Unlike the existing SAR ADCs that ignore the residual voltage 382 ($V_{RES}$ 382), the noise-shaping circuit 134 enables the reconfigurable ADC 128 to add or subtract the residual voltage 382 ($V_{RES}$ 382) from one cycle to another cycle of the analog-to-digital conversion. To do so, the noise-shaping circuit 134 includes, in part, an amplifier 326. A first input of the amplifier 326 is coupled to the first input 302-1 of the comparator 302 and to the first terminal of the capacitor $C_2$ 316. A second input of the amplifier 326 is coupled to an output of the amplifier 326. The noise-shaping circuit 134 also includes a switch $\phi_{RES1}$ 328 having a first and a second terminal, a switch $\phi_{RES1}$ 330 having a first and a second terminal, a switch $\phi_{RES2}$ 332 having a first and a second terminal, a switch $\phi_{RES2}$ 334 having a first and a second terminal, and a capacitor $C_{RES}$ 336 having a first and a second terminal. The first terminal of the switch $\phi_{RES1}$ 328 is coupled to the output of the amplifier 326 and the first terminal of the switch $\phi_{RES2}$ 334. The second terminal of the switch $\phi_{RES1}$ 328 is coupled to the first terminal of the switch $\phi_{RES2}$ 332 and the second terminal of the capacitor $C_{RES}$ 336. The second terminal of the switch $\phi_{RES2}$ 332 is coupled to the first input 302-1 of the comparator 302, the first terminal of the capacitor $C_2$ 316, and the first input of the amplifier 326. The first terminal of the capacitor $C_{RES}$ 336 is coupled to the second terminal of the switch $\phi_{RES2}$ 334 and the second terminal of the switch $\phi_{RES1}$ 330. The first terminal of switch $\phi_{RES1}$ 330 is coupled to the common-mode voltage 324 ($V_{CM}$ 324) and first terminal of the switch $\phi_2$ 322.

In the first mode 210, as is detailed in the example schematic 300-1 of FIG. 3-1 and the timing diagram 384 of FIG. 3-2, after the reconfigurable ADC 128 opens the switch $\phi_2$ 322 and the switches 312-1 to 312-10 at the falling edge of the second phase ($\phi_2$) at time $t_3$, the reconfigurable ADC 128 stores the residual voltage 382 ($V_{RES}$ 382) of a previous analog-to-digital conversion cycle at the first terminal of the capacitor $C_2$ 316. The reconfigurable ADC 128 then closes the switches $\phi_{RES2}$ 332 and $\phi_{RES2}$ 334 at a rising edge of the second residual phase ($\phi_{RES2}$) at time $t_4$, where time $t_4$ is greater than time $t_3$. Subsequently, during the second residual phase ($\phi_{RES2}$), the noise-shaping circuit 134 enables the reconfigurable ADC 128 to store the residual voltage 382 ($V_{RES}$ 382), which was previously stored at the first terminal of the capacitor $C_2$ 316, at the capacitor $C_{RES}$ 336. At a falling edge of the second residual phase ($\phi_{RES2}$), the reconfigurable ADC 128 opens the switches $\phi_{RES2}$ 332 and $\phi_{RES2}$ 334 at time 6, where time $t_5$ is greater than time $t_4$.

Utilizing a clock signal, fed through a third input $\phi_{COMP}$ 302-3 of the comparator 302, the configurable ADC 128 performs the N comparison periods of a new analog-to-digital conversion cycle during the comparator phase ($\phi_{COMP}$) (illustrated as pulses 1, 2, . . . , (N-1), and N)

between times $t_6$ and $t_7$. Note that time $t_6$ is greater than time $t_5$, and time $t_7$ is greater than time $t_6$. Thus, unlike the existing SAR ADCs that ignore the residual voltage 382 ($V_{RES}$ 382), the reconfigurable ADC 128 feeds the residual voltage 382 ($V_{RES}$ 382) of the previous analog-to-digital conversion cycle to the first input 302-1 of the comparator 302, in the new analog-to-digital conversion cycle. After performing the $N^{th}$ comparison period of the new analog-to-digital conversion cycle, at a rising edge of the first residual phase ($\phi_{RES1}$), the reconfigurable ADC 128 closes the switches $\phi_{RES1}$ 328 and $\phi_{RES1}$ 330 at time $t_8$, where time $t_8$ is greater than time $t_7$. During the first residual phase ($\phi_{RES1}$), the reconfigurable ADC 128 stores a new-resulting residual voltage 382 ($V_{RES}$ 382) from the new analog-to-digital conversion cycle. At a falling edge of the first residual phase ($\phi_{RES1}$), the reconfigurable ADC 128 opens the switches $\phi_{RES1}$ 328 and $\phi_{RES1}$ 330 at time $t_9$, where time $t_9$ is greater than time $t_8$. This is an iterative process that enables the reconfigurable ADC 128 to achieve a high ENOB resolution, as is illustrated below in Table 1.

For ease of description and the sake of clarity, the noise-shaping shaping circuit 134 in FIG. 3-1 and the timing diagram 384 in FIG. 3-2 help illustrate how the reconfigurable ADC 128 can achieve a first-order noise shaping. For the first-order noise shaping, the reconfigurable ADC 128 feeds the residual voltage 382 ($V_{RES}$ 382) of the previous analog-to-digital conversion cycle to the first input 302-1 of the comparator 302, in the new analog-to-digital conversion cycle. A computing device manufacturer may use a similar method and/or technique to design and build a reconfigurable ADC 128 that can achieve a greater-than-one-order (e.g., four, five, and so forth) noise shaping. For example, in addition to the amplifier 326, the switch $\phi_{RES1}$ 328, the switch $\phi_{RES2}$ 332, the switch $\phi_{RES2}$ 334, the capacitor $C_{RES}$ 336, and the switch $\phi_{RES1}$ 328, the computing device manufacturer may apply a similar arrangement and/or coupling of switches, amplifiers, and capacitors several times to increase the order of the noise shaping. By so doing, the reconfigurable ADC 128 can weight residual voltages (e.g., $V_{RES}$ 382) from several previous analog-to-digital conversion cycles and feed them to the first input 302-1 of the comparator 302 in the new analog-to-digital conversion cycle. Thus, in aspects, the residual voltage or a weighted residual voltage from one or more previous ADC cycles may be applied to an input voltage or a sampled input voltage of a current or next ADC cycle to enable noise reduction for that ADC cycle.

Given that human hearing ranges from twenty Hertz (20 Hz) to twenty thousand Hertz (20 kHz), a good-quality microphone requires supporting a bandwidth approximately equal to 20 kHz. In the first mode 210, the reconfigurable ADC 128 uses a sampling rate that is considerably larger than the Nyquist rate. For example, the reconfigurable ADC 128 may use a sampling rate of 768 kHz, enabling the reconfigurable ADC 128 to achieve a resolution of approximately eighteen ENOBs, as is illustrated below in Table 1.

FIG. 3-2 illustrates the operation of the SAR ADC 130 by describing an example 4-bit conversion 380. As is described in FIG. 3-1, the SAR ADC 130 performs a higher-than-four-bit conversion (e.g., a 10-bit conversion). The example 4-bit conversion 380 helps explain the operation of the SAR ADC 130 with ease and clarity. The same concepts are applicable in describing the SAR ADC 130 performing the higher-than-four-bit conversion (e.g., the 10-bit conversion).

FIG. 3-2 also illustrates the timing diagram 384 for operating the reconfigurable ADC. The timing diagram 384, however, focuses on explaining the first mode 210, where the reconfigurable ADC 128 operates in the first phase ($\phi_1$), the second phase ($\phi_2$), the comparator phase ($\phi_{COMP}$), the first residual phase ($\phi_{RES1}$), and the second residual phase ($\phi_{RES2}$). In the modes 212 to 216, the reconfigurable ADC 128 operates in fewer phases, as is further described below.

FIG. 3-3 illustrates an example schematic 300-3 of the reconfigurable ADC 128 operating in the second mode 212 or the third mode 214 by utilizing the SAR ADC 130 and the noise-canceling circuit 132. FIG. 3-3 is described in the context of FIGS. 1 to 3-2, the reconfigurable ADC 128, and the computing device 102. The example schematic 300-3 is an equivalent representation of the example schematic 300-1 when the reconfigurable ADC 128 operates in the second mode 212 or the third mode 214. In the second mode 212 or the third mode 214, the reconfigurable ADC 128 operates in fewer phases than in the first mode 210. Specifically, in the second mode 212 or the third mode 214, the reconfigurable ADC 128 operates in the following phases: the first phase ($\phi_1$), the second phase ($\phi_2$), and the comparator phase ($\phi_{COMP}$). Note that in the second mode 212 or the third mode 214, the reconfigurable ADC 128 ignores the first residual phase ($\phi_{RES1}$) and the second residual phase ($\phi_{RES2}$), for example, by keeping open the switches $\phi_{RES1}$ 328, $\phi_{RES1}$ 330, $\phi_{RES2}$ 332, and $\phi_{RES2}$ 334. Therefore, in the second mode 212 or the third mode 214, the reconfigurable ADC 128 does not utilize the noise-shaping circuit 134.

Like the first mode 210, in the second mode 212 the reconfigurable ADC 128 uses a sampling rate that is considerably larger than the Nyquist rate to support a bandwidth approximately equal to 20 kHz. For example, in the second mode 212 the reconfigurable ADC 128 may use a same sampling rate (e.g., 768 kHz) as in the first mode 210. Nevertheless, in the second mode 212 the reconfigurable ADC 128 does not utilize the noise-shaping circuit 134, enabling a reduction in power consumption. As a result, in the second mode 212 the reconfigurable ADC 128 achieves a resolution of approximately thirteen ENOB s, as is illustrated below in Table 1.

Unlike the modes 210 and 212, in the third mode 214 the reconfigurable ADC 128 uses a sampling rate that is approximately equal to the Nyquist rate to support a bandwidth approximately equal to 20 kHz. For example, in the third mode 214 the reconfigurable ADC 128 may use a sampling rate of 48 kHz, which is considerably lower than the sampling rates of the modes 210 and 212. A lower sampling rate enables the reconfigurable ADC 128 to reduce power consumption. In addition, like the second mode 212, in the third mode 214 the reconfigurable ADC 128 does not utilize the noise-shaping circuit 134, enabling a further reduction in power consumption. In the third mode 214 the reconfigurable ADC 128 may achieve a resolution of approximately ten ENOBs, as is illustrated below in Table 1.

Figures 3, 4:
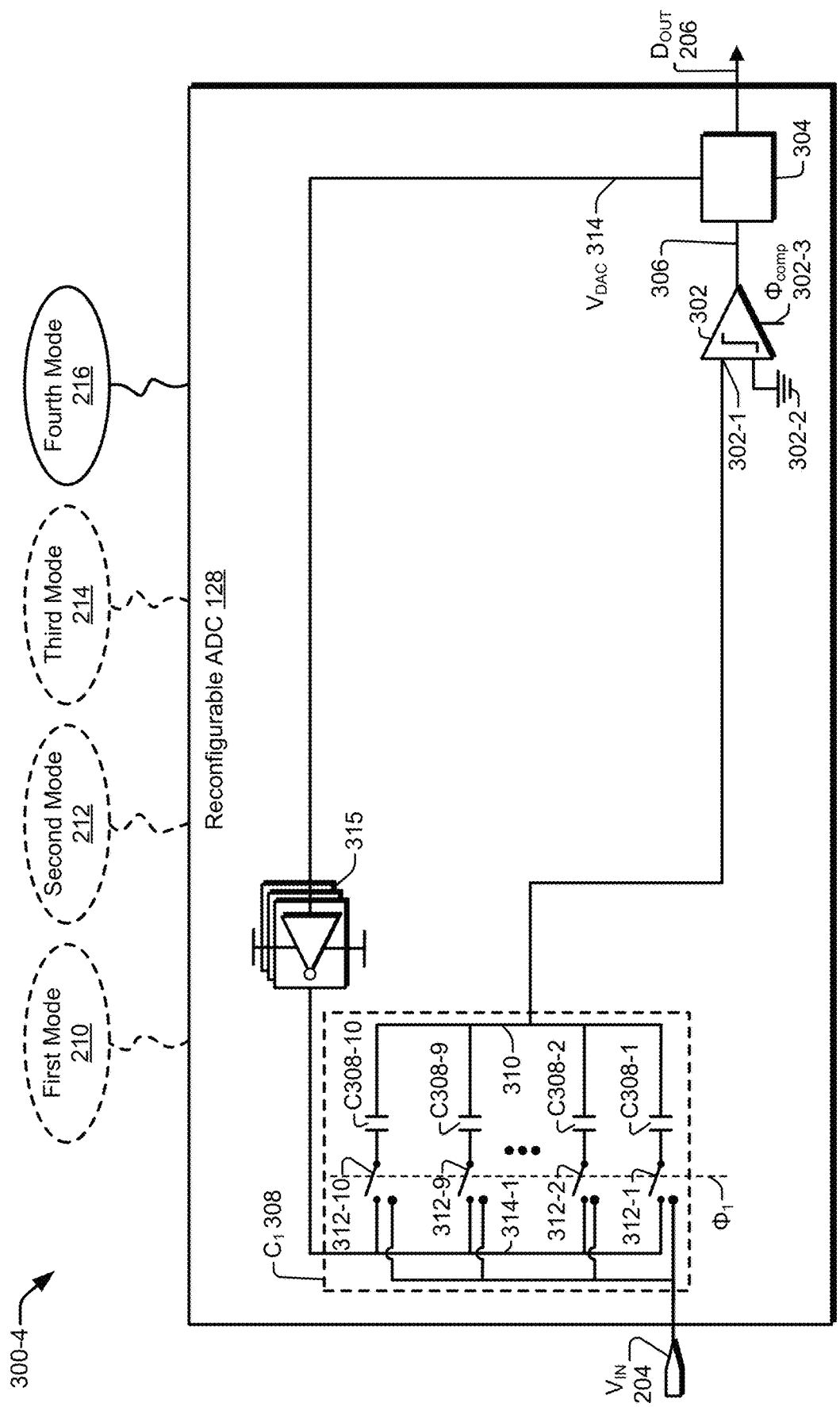
Figures 2, 4:
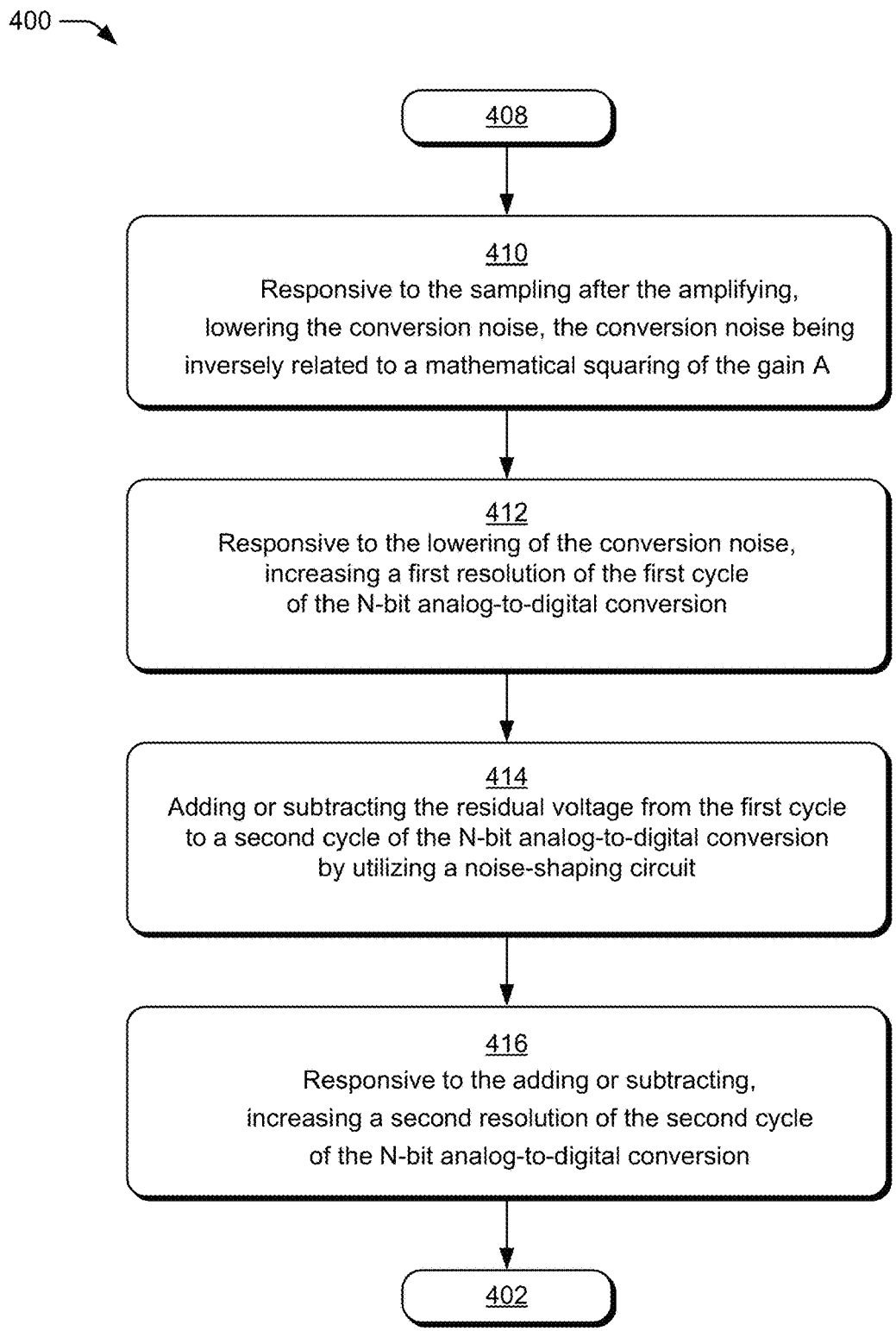

FIG. 3-4 illustrates the example schematic 300-4 of the reconfigurable ADC 128 operating in the fourth mode 216 by utilizing the SAR ADC 130. FIG. 3-4 is described in the context of FIGS. 1 to 3-2, the reconfigurable ADC 128, and the computing device 102. The example schematic 300-4 is an equivalent representation of the example schematic 300-1 when the reconfigurable ADC 128 operates in the fourth mode 216. In the fourth mode 216, the reconfigurable ADC 128 operates in fewer phases than in the modes 212, 214, and 216. Specifically, in the fourth mode 216, the reconfigurable ADC 128 operates in the following phases: the first phase ($\phi_1$) and the comparator phase ($\phi_{COMP}$). Note that in the fourth mode 216, the reconfigurable ADC 128 excludes the second phase ($\phi_2$), the first residual phase ($\phi_{RES1}$), and the second residual phase ($\phi_{RES2}$), for example, by keeping open the switches $\phi_{RES1}$ 328, $\phi_{RES1}$ 330, $\phi_{RES2}$ 332, $\phi_{RES2}$ 334, and $\phi_2$ 322, and by keeping closed the switch $\phi_1$ 320. Therefore, in the fourth mode 216, the reconfigurable ADC 128 does not utilize the noise-shaping circuit 134 or the noise-canceling circuit 132. As a result, in the fourth mode 216, the reconfigurable ADC 128 operates similarly to the existing SAR ADCs, by using a single sample and/or hold state.

In the fourth mode 216, the reconfigurable ADC 128 uses a sampling rate that is approximately equal to the Nyquist rate to support a bandwidth approximately equal to 8 kHz. For example, in the fourth mode 216, the reconfigurable ADC 128 may use a sampling rate of 16 kHz. By not utilizing the noise-shaping circuit 134 or the noise-canceling circuit 132, the reconfigurable ADC 128 enables a further reduction in power consumption. In the fourth mode 216, the reconfigurable ADC 128 may achieve a resolution of approximately eight ENOBs, as is illustrated below in Table 1.

Table 1 illustrates some example operation modes of the reconfigurable ADC 128 that can be implemented by selectively enabling or disabling various combinations of the noise-canceling circuit 132, the noise-shaping circuit 134, and/or by sampling at or above the Nyquist rate.

ADC 128 may only consume approximately two percent (2%) of the power compared when operating in the first mode 210 (e.g., 100% may represent 80 to 120 microwatts (µW)). As another example, in the fourth mode 216, the microphone 122 may only consume approximately one percent (1%) of the power compared when operating in the first mode 210 (e.g., 100% may represent 250 to 300 µW). Conservation of power during the overall usage of the computing device 102 enhances the user experience.

Example Methods

FIGS. 4-1 and 4-2 jointly illustrate an example method 400 for performing an N-bit analog-to-digital conversion, performed by the reconfigurable ADC 128. To do so, the reconfigurable ADC 128 utilizes the SAR ADC 130, the noise-canceling circuit 132, and the noise-shaping circuit 134. The example method 400 includes stages 402 to 416, which are illustrated in FIGS. 4-1 and 4-2. The example method 400 is described in the context of FIGS. 1 to 3-4, the computing device 102, and the reconfigurable ADC 128. The operations performed in the example method 400 may be performed in a different order or with additional or fewer steps than what is shown in FIGS. 4-1 and 4-2.

TABLE 1

| | Mode of Operation | | | |
|---|---|---|---|---|
| | First Mode 210 | Second Mode 212 | Third Mode 214 | Fourth Mode 216 |
| Resolution in effective number of bits (ENOBs) | ~18 | ~13 | ~10 | ~8 |
| Brief Description of the Operation of the Reconfigurable ADC 128 | SAR with Noise Shaping, Noise Canceling, and Oversampling | SAR with Noise Canceling and Oversampling | SAR with Noise Canceling and Sampling at the Nyquist Rate | SAR with Sampling at the Nyquist Rate |
| Bandwidth in kilohertz (kHz) | 20 | 20 | 20 | 8 |
| Sampling Rate in kilohertz (kHz) | 768 | 768 | 48 | 16 |
| Estimated Power Consumption of the Microphone 122 | 100% | ~30% | ~10% | ~1% |
| Estimated Power Consumption of the Reconfigurable ADC 128 | 100% | ~60% | ~3% | ~2% |

As is illustrated in Table 1, in all the modes of operation, the reconfigurable ADC 128 may use a sampling rate that is at least equal to the Nyquist rate, enabling the reconfigurable ADC 128 to avoid distortion or aliasing. In some modes of operation (e.g., 210, 212), the reconfigurable ADC 128 may use oversampling. In other modes of operation (e.g., 214, 216), the reconfigurable ADC 128 may use a sampling rate that is approximately equal to the Nyquist rate. As is illustrated in Table 1, there is a direct relationship between the sampling rate and the power consumed by the reconfigurable ADC 128. Also, there is a direct relationship between the bandwidth and the power consumed by the reconfigurable ADC 128. Table 1 also illustrates that the reconfigurable ADC 128 supports a dynamic range of audio quality, varying bandwidths (e.g., 8 kHz, 20 kHz), varying sampling rates (e.g., 16 kHz, 48 kHz, 768 kHz), numerous ENOB resolutions (e.g., eight, ten, thirteen, eighteen), and conservation of power during the overall usage of the computing device 102. For example, in the fourth mode 216, the reconfigurable At stage 402, the reconfigurable ADC 128 performs a first cycle of an N-bit (e.g., 10-bit) analog-to-digital conversion of an analog input voltage (e.g., $V_{IN}$ 204) by utilizing the SAR ADC 130. Note that the N-bit analog-to-digital conversion has an ENOB resolution, as is described in Equation 1. As a result, at stage 404, the reconfigurable ADC 128 generates an N-bit digital output (e.g., $D_{OUT}$ 206, 10-bit $D_{OUT}$ 206). Unfortunately, the N-bit analog-to-digital conversion includes a conversion noise (e.g., C/kT noise) and a residual voltage (e.g., $V_{RES}$ 382) after first cycle of the N-bit analog-to-digital conversion, as is described in Equation 2 and FIGS. 3-1 and 3-2. To this end, initially, at stage 406, the reconfigurable ADC 128 amplifies a difference in the analog input voltage (e.g., $V_{IN}$ 204) between two close time intervals (e.g., $t_3$ and $t_2$ in FIG. 3-2) by utilizing a preamplifier (e.g., 318) with a gain A. Then, at stage 408, in certain modes of operation (e.g., 210), the reconfigurable ADC 128 utilizes the noise-canceling circuit 132 to sample the difference in the analog input voltage (e.g., $V_{IN}$ 204) after amplifying the analog input voltage ($V_{IN}$ 204). In part, the noise canceling-circuit 132 utilizes the capacitor $C_2$ 316 coupled between the preamplifier 318 and the comparator 302 of the SAR ADC 130 to sample the analog input voltage ($V_{IN}$ 204). By so doing, at stage 410, the noise-canceling circuit 132 lowers the conversion noise (e.g., C/kT noise). Recall that as is illustrated in Equation 3, the C/kT noise is inversely related to $A^2$. By lowering the C/kT noise, at stage 412, the noise-canceling circuit 132 enables the reconfigurable ADC 128 to increase an ENOB resolution of the first cycle of the N-bit (e.g., 10-bit) analog-to-digital conversion.

To further increase the ENOB resolution like the sigma-delta ADC, for example, to approximately eighteen ENOBs, the reconfigurable ADC 128 also utilizes the noise-shaping circuit 134. Specifically, at stage 414, the noise-shaping circuit 134 enables the reconfigurable ADC 128 to add or subtract the residual voltage 382 ($V_{RES}$ 382) from the first cycle to a second cycle of the N-bit analog-to-digital conversion. In detail, as is described in FIGS. 3-1 and 3-2, the reconfigurable ADC 128 feeds the residual voltage 382 ($V_{RES}$ 382) of the first cycle of the N-bit analog-to-digital conversion cycle to the first input 302-1 of the comparator 302, in the second cycle of the N-bit analog-to-digital conversion. In addition, as is described in FIGS. 3-1, the reconfigurable ADC 128 can achieve a greater-than-one-order (e.g., four, five, and so forth) noise shaping. The reconfigurable ADC 128 can weight residual voltages (e.g., $V_{RES}$ 382) from several previous analog-to-digital conversion cycles and feed them to the first input 302-1 of the comparator 302 in the new analog-to-digital conversion cycle. By so doing, at stage 416, the noise-shaping circuit 134 enables the reconfigurable ADC 128 to increase the ENOB resolution of the second cycle of the N-bit analog-to-digital conversion. The example method 400 is an iterative process.

The following are additional examples of the described apparatuses, methods, and techniques that enable the reconfigurable ADC 128 to support a dynamic range of audio quality, varying bandwidths, varying sampling rates, numerous ENOB resolutions, conserve power during an overall usage of the computing device, and enhance the user experience.

Example 1. An apparatus comprising: a reconfigurable analog-to-digital converter, ADC, the reconfigurable ADC (128) configured to selectively support at least two different resolution settings, and the reconfigurable ADC (128) including: a successive-approximation-register, SAR, ADC, the SAR ADC (130) configured to: perform a first cycle of an N-bit analog-to-digital conversion of an analog input voltage (204) to generate an N-bit digital output (206), the N-bit analog-to-digital conversion including a conversion noise and a residual voltage (382) after the first cycle of the N-bit analog-to-digital conversion; and amplify a difference in the analog input voltage (204) between two close time intervals; a noise-canceling circuit (132), the noise-canceling circuit (132) configured to lower the conversion noise by sampling the analog input voltage (204) after the amplification of the difference in the analog input voltage (204); and a noise-shaping circuit (134), the noise-shaping circuit (134) configured to add or subtract the first residual voltage (382) from the first cycle to a second cycle of the N-bit analog-to-digital conversion to reducing a quantization noise in the second cycle of the N-bit analog-to-digital conversion.

Example 2. The apparatus of example 1, wherein the residual noise is a first residual noise of the first cycle of the N-bit analog-to-digital conversion, the second cycle of N-bit analog-to-digital conversion includes a second residual voltage, and wherein the reconfigurable ADC (128) is configured to utilize the noise-shaping circuit (134) to: weight the first residual voltage from the first cycle and the second residual voltage from the second cycle; and add or subtract the weighted residual voltages from the first and the second cycle to a third cycle of the N-bit analog-to-digital conversion, further reducing the quantization of the third cycle of the N-bit analog-to-digital conversion.

Example 3. The apparatus of examples 1 or 2, wherein: a resolution of the at least two different resolution settings is measured or calculated in effective number of bits, ENOBs; and/or the conversion noise comprises a value that is approximately equal to the Boltzmann constant, k, multiplied by a period of a sampling time, T, and divided by a sampling capacitance, C; and/or the first and the second residual voltages comprise a difference between an output voltage (314) of a digital-to-analog converter, DAC, and the analog input voltage (204).

Example 4. The apparatus of any of examples 1 to 3, wherein: lowering the conversion noise increases the resolution of the at least two different resolution settings of the reconfigurable ADC (128); adding or subtracting the first residual voltage (382) from the first cycle to the second cycle of the N-bit analog-to-digital conversion increases the resolution of the at least two different resolution settings of the reconfigurable ADC (128).

Example 5. The apparatus of any of examples 1 to 4, wherein the SAR ADC (130) includes: a comparator (302); a logic block (304), wherein the logic block (304) is configured to output the N-bit digital output (206) and the output voltage (314) of the DAC; a capacitive DAC, CDAC, the CDAC utilizing a capacitance array (308); and a preamplifier (318) with a gain A coupled between a common terminal of the capacitance array (308) and the comparator (302), wherein the preamplifier (318) is configured to amplify the difference in the analog input voltage (204) between two close time intervals.

Example 6. The apparatus of any of examples 1 to 5, wherein the noise-canceling circuit (132) includes: a first capacitor (316) having a first and a second terminal, and wherein: the second terminal of the first capacitor (316) coupled to an output of the preamplifier (318); and the first terminal of the first capacitor (316) coupled between the preamplifier (318) and the comparator (302); a common-mode voltage (324); and a first switch (322) having a first and a second terminal, and wherein: the first terminal of the first switch (322) coupled to the common-mode voltage (324); and the second terminal of the first switch (322) coupled to the first terminal of the first capacitor (316).

Example 7. The apparatus of any of examples 1 to 6, wherein the noise-shaping circuit (134) includes: an amplifier (326) having a first input, a second input, and an output; a second switch (328) having a first and a second terminal; a third switch (330) having a first and a second terminal; a fourth switch (332) having a first and a second terminal; a fifth switch (334) having a first and a second terminal; and a second capacitor (336) having a first and a second terminal.

Example 8. The apparatus of any of examples 1 to 7, wherein: the first terminal of the second switch (328) is coupled to the output of the amplifier (326) and the first terminal of the fifth switch (334); the second terminal of the second switch (328) is coupled to the first terminal of the fourth switch (332) and the second terminal of the second capacitor (336); the second terminal of the fourth switch (332) is coupled to a first input of the comparator (302), the first terminal of the first capacitor (316), and the first input of the amplifier (326); the first terminal of the second capacitor (336) is coupled to the second terminal of the fifth switch (334) and the second terminal of the third switch (330); and the first terminal of the third switch (330) is coupled to the common-mode voltage (324) and the first terminal of the first switch (322).

Example 9. The apparatus of any of examples 1 to 8, wherein the reconfigurable ADC (128) configured to selectively operate in at least two different modes of operation, the at least two modes of operation comprise: a first mode (210), the first mode (210) utilizing the SAR ADC (130), the noise-canceling circuit (132), and the noise-shaping circuit (134); a second mode (212), the second mode (212) utilizing the SAR ADC (130) and the noise-canceling circuit (132); a third mode (214), the third mode (214) utilizing the SAR ADC (130) and the noise-canceling circuit (132); and a fourth mode (216), the fourth mode (216) utilizing the SAR ADC (130).

Example 10. The apparatus of example 8, wherein the reconfigurable ADC (128) configured to selectively operate in: the first mode (210) by operating in a first phase, a second phase, a comparator phase, a first residual phase, and a second residual phase; the second mode (212) by operating in the first phase, the second phase, and the comparator phase; the third mode (214) by operating in the first phase, the second phase, and the comparator phase; and the fourth mode (216) by operating in first phase and the comparator phase.

Example 11. The apparatus of any of examples 1 to 10, wherein the reconfigurable ADC (128) configured to selectively support the at least two different resolution settings by consuming at least two different amounts of power, supporting at least two different bandwidths, and operating in at least two different sampling rates.

Example 12. The apparatus of any of example 11, wherein: the at least two different resolution settings include a first, a second, a third, and a fourth ENOB resolution, and wherein: the first ENOB resolution is higher than the second ENOB resolution; the second ENOB resolution is higher than the third ENOB resolution; and the third ENOB resolution is higher than the fourth ENOB resolution; and/or the at least two different amounts of power include a first, a second, a third, and a fourth amount of power, and wherein: the first amount of power is higher than the second amount of power; the second amount of power is higher than the third amount of power; and the third amount of power being is than the fourth amount of power; and/or the at least two different bandwidths include a first and a second bandwidth, and wherein: the first bandwidth is higher than the second bandwidth; and/or the at least two different sampling rates include a first and a second sampling rate, and wherein: the first sampling rate is considerably larger than a Nyquist rate; and the second sampling rate is approximately equal to the Nyquist rate.

Example 13. The apparatus of example 12 and examples 9 or 10, the reconfigurable ADC (128) configured to selectively operate in: the first mode (210), the first mode (210) supporting the first ENOB resolution, consuming the first amount of power, supporting the first bandwidth, and operating in the first sampling rate; the second mode (212), the second mode (212) supporting the second ENOB resolution, consuming the second amount of power, supporting the first bandwidth, and operating in the first sampling rate; the third mode (214), the third mode (214) supporting the third ENOB resolution, consuming the third amount of power, supporting the first bandwidth, and operating in the second sampling rate; and the fourth mode (216), the fourth mode (216) supporting the fourth ENOB resolution, consuming the fourth amount of power, supporting the second bandwidth, and operating in the second sampling rate.

Example 14. A method comprising: performing a first cycle of an N-bit analog-to-digital conversion of an analog input voltage (204) by utilizing a successive-approximation-register analog-to-digital converter, SAR ADC, (130); responsive to the performing, generating an N-bit digital output (206), and the N-bit analog-to-digital conversion including a conversion noise and a residual voltage (382); amplifying a difference in the analog input voltage (204) between two close time intervals by utilizing a preamplifier (318) with a gain A; sampling, after amplifying the difference in the analog input voltage (204) between two close time intervals, the analog input voltage (204), by utilizing a noise-canceling circuit (132); responsive to the sampling after the amplifying, lowering the conversion noise, the conversion noise being inversely related to a mathematical squaring of the gain A; responsive to the lowering of the conversion noise, increasing a first resolution of the first cycle of the N-bit analog-to-digital conversion; adding or subtracting the residual voltage (382) from the first cycle to a second cycle of the N-bit analog-to-digital conversion by utilizing a noise-shaping circuit (134); and responsive to the adding or subtracting, increasing a second resolution of the second cycle of the N-bit analog-to-digital conversion.

Example 15. The method of example 14, wherein: a reconfigurable analog-to-digital converter, ADC, 128, includes the SAR ADC (130), the noise-canceling circuit (132), and the noise-shaping circuit (134); the reconfigurable ADC selectively supporting at least two different resolution settings by operating in at least two different modes of operation; and the at least two different resolution settings being measured or calculated in effective number of bits, ENOBs.

Example 16. The method of example 14 or 15, wherein the at least two modes of operation comprise: a first mode (210), the first mode (210) utilizing the SAR ADC (130), the noise-canceling circuit (132), and the noise-shaping circuit (134); a second mode (212), the second mode (212) utilizing the SAR ADC (130) and the noise-canceling circuit (132); a third mode (214), the third mode (214) utilizing the SAR ADC (130) and the noise-canceling circuit (132); and a fourth mode (216), the fourth mode (216) utilizing the SAR ADC (130).

Example 17. The method of any of example 16, wherein: operating in the first mode (210) comprises operating in a first phase, a second phase, a comparator phase, a first residual phase, and a second residual phase; operating in the second mode (212) comprises operating in the first phase, the second phase, and the comparator phase; operating in the third mode (214) comprises operating in the first phase, the second phase, and the comparator phase; and operating in the fourth mode (216) comprises operating in first phase and the comparator phase.

Example 18. The method of any of examples 14 to 17, wherein the reconfigurable ADC (128) selectively supports the at least two different resolution settings by consuming at least two different amounts of power, supports at least two different bandwidths, and operates in at least two different sampling rates.

Example 19. The method of any of example 18, wherein: the at least two different resolution settings include a first, a second, a third, and a fourth ENOB resolution, and wherein: the first ENOB resolution is higher than the second ENOB resolution; the second ENOB resolution is higher than the third ENOB resolution; and the third ENOB resolution is higher than the fourth ENOB resolution; and/or the at least two different amounts of power include a first, a second, a third, and a fourth amount of power, and wherein: the first amount of power is higher than the second amount of power; the second amount of power is higher than the third amount of power; and the third amount of power being is than the fourth amount of power; and/or the at least two different bandwidths include a first and a second bandwidth, and wherein: the first bandwidth is higher than the second bandwidth; and the at least two different sampling rates include a first and a second sampling rate, and wherein: the first sampling rate is considerably larger than a Nyquist rate; and the second sampling rate is approximately equal to the Nyquist rate.

Example 20. The method of any of example 19 and examples 16 or 17, the reconfigurable ADC (128) selectively operating in: the first mode (210), the first mode (210) supporting the first ENOB resolution, consuming the first amount of power, supporting the first bandwidth, and operating in the first sampling rate; the second mode (212), the second mode (212) supporting the second ENOB resolution, consuming the second amount of power, supporting the first bandwidth, and operating in the first sampling rate; the third mode (214), the third mode (214) supporting the third ENOB resolution, consuming the third amount of power, supporting the first bandwidth, and operating in the second sampling rate; and the fourth mode (216), the fourth mode (216) supporting the fourth ENOB resolution, consuming the fourth amount of power, supporting the second bandwidth, and operating in the second sampling rate.

Example 21. A system comprising: at least one processor (108); at least one sensor (120); at least one sensor interface circuit (124) having at least one reconfigurable amplifier (128) and a reconfigurable analog-to-digital converter, ADC, (130), wherein the reconfigurable ADC (130) comprises: a successive-approximation-register, SAR, ADC, (132); a noise-canceling circuit (132); and a noise-shaping circuit (134); and at least one computer-readable medium having instructions thereon that, responsive to execution by the at least one processor, performs the operations of the method of any of claims 14 to 20.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

What is claimed:

1. An apparatus comprising:
    a reconfigurable analog-to-digital converter (ADC), the reconfigurable ADC configured to selectively support at least two different resolution settings, the reconfigurable ADC including:
        a successive-approximation-register (SAR) ADC, the SAR ADC configured to:
            perform a first cycle of an N-bit analog-to-digital conversion of an analog input voltage to generate an N-bit digital output, the N-bit analog-to-digital conversion including a conversion noise and a residual voltage after the first cycle of the N-bit analog-to-digital conversion; and
            amplify a difference in the analog input voltage between two close time intervals;
        a noise-canceling circuit configured to lower the conversion noise by sampling the analog input voltage after amplifying the difference in the analog input voltage; and
        a noise-shaping circuit configured to add or subtract the residual voltage from the first cycle to a second cycle of the N-bit analog-to-digital conversion to reduce a quantization noise of the second cycle of the N-bit analog-to-digital conversion, the reconfigurable ADC being configured to selectively operate in one of at least two different modes of operation that comprise at least two of:
            a first mode of operation, the first mode of operation configured to use the SAR ADC, the noise-canceling circuit, and the noise-shaping circuit;
            a second mode of operation, the second mode of operation configured to use the SAR ADC and the noise-canceling circuit;
            a third mode of operation, the third mode of operation configured to use the SAR ADC and the noise-canceling circuit; and
            a fourth mode of operation, the fourth mode of operation configured to use the SAR ADC.

2. The apparatus of claim 1, wherein the residual noise is a first residual noise of the first cycle of the N-bit analog-to-digital conversion, the second cycle of N-bit analog-to-digital conversion includes a second residual voltage, and wherein the reconfigurable ADC is configured to utilize the noise-shaping circuit to:
    weight the first residual voltage from the first cycle and the second residual voltage from the second cycle; and
    add or subtract the weighted residual voltages from the first and the second cycle to a third cycle of the N-bit analog-to-digital conversion, further reducing the quantization of the third cycle of the N-bit analog-to-digital conversion.

3. The apparatus of claim 2, wherein:
    a resolution of the at least two different resolution settings is measured or calculated in effective number of bits (ENOBs);
    the conversion noise comprises a value that is approximately equal to a Boltzmann constant (k) multiplied by a period of a sampling time (T) and divided by a sampling capacitance (C); and
    the first and the second residual voltages comprise a difference between an output voltage of a digital-to-analog converter (DAC) and the analog input voltage.

4. The apparatus of claim 3, wherein the SAR ADC includes:
    a comparator;
    a logic block configured to output the N-bit digital output and an output voltage of the DAC;
    a capacitive DAC (CDAC) utilizing a capacitance array; and
    a preamplifier with a gain A coupled between a common terminal of the capacitance array and the comparator, wherein the preamplifier is configured to amplify the difference in the analog input voltage between two close time intervals.

5. The apparatus of claim 4, wherein the noise-canceling circuit includes:
    a first capacitor having a first and a second terminal, and wherein:
        the second terminal of the first capacitor coupled to an output of the preamplifier; and the first terminal of the first capacitor coupled between the preamplifier and the comparator;
a common-mode voltage; and
a first switch having a first and a second terminal, and wherein:
the first terminal of the first switch coupled to the common-mode voltage; and
the second terminal of the first switch coupled to the first terminal of the first capacitor.

6. The apparatus of claim 5, wherein the noise-shaping circuit includes:
an amplifier having a first input, a second input, and an output;
a second switch having a first and a second terminal;
a third switch having a first and a second terminal;
a fourth switch having a first and a second terminal;
a fifth switch having a first and a second terminal; and
a second capacitor having a first and a second terminal.

7. The apparatus of claim 6, wherein:
the first terminal of the second switch is coupled to the output of the amplifier and the first terminal of the fifth switch;
the second terminal of the second switch is coupled to the first terminal of the fourth switch and the second terminal of the second capacitor;
the second terminal of the fourth switch is coupled to a first input of the comparator, the first terminal of the first capacitor, and the first input of the amplifier;
the first terminal of the second capacitor is coupled to the second terminal of the fifth switch and the second terminal of the third switch; and
the first terminal of the third switch is coupled to the common-mode voltage and the first terminal of the first switch.

8. The apparatus of claim 1, wherein the reconfigurable ADC is configured to selectively operate in:
the first mode by operating in a first phase, a second phase, a comparator phase, a first residual phase, and a second residual phase;
the second mode by operating in the first phase, the second phase, and the comparator phase;
the third mode by operating in the first phase, the second phase, and the comparator phase; and
the fourth mode by operating in first phase and the comparator phase.

9. The apparatus of claim 8, wherein the reconfigurable ADC is configured to selectively support the at least two different resolution settings by consuming at least two different amounts of power, supporting at least two different bandwidths, and operating in at least two different sampling rates.

10. The apparatus of claim 9, wherein:
the at least two different resolution settings include a first, a second, a third, and a fourth ENOB resolution, and wherein:
the first ENOB resolution is higher than the second ENOB resolution;
the second ENOB resolution is higher than the third ENOB resolution; and
the third ENOB resolution is higher than the fourth ENOB resolution;
the at least two different amounts of power include a first, a second, a third, and a fourth amount of power, and wherein:
the first amount of power is higher than the second amount of power;
the second amount of power is higher than the third amount of power; and
the third amount of power being is than the fourth amount of power;
the at least two different bandwidths include a first and a second bandwidth, and wherein:
the first bandwidth is higher than the second bandwidth; and
the at least two different sampling rates include a first and a second sampling rate, and wherein:
the first sampling rate is considerably larger than a Nyquist rate; and
the second sampling rate is approximately equal to the Nyquist rate.

11. The apparatus of claim 10, wherein the reconfigurable ADC is configured to selectively operate in:
the first mode, the first mode supporting the first ENOB resolution, consuming the first amount of power, supporting the first bandwidth, and operating in the first sampling rate;
the second mode, the second mode supporting the second ENOB resolution, consuming the second amount of power, supporting the first bandwidth, and operating in the first sampling rate;
the third mode, the third mode supporting the third ENOB resolution, consuming the third amount of power, supporting the first bandwidth, and operating in the second sampling rate; and
the fourth mode, the fourth mode supporting the fourth ENOB resolution, consuming the fourth amount of power, supporting the second bandwidth, and operating in the second sampling rate.

12. A method comprising:
performing a first cycle of an N-bit analog-to-digital conversion of an analog input voltage by utilizing a successive-approximation-register (SAR) analog-to-digital converter (ADC) of a reconfigurable ADC;
responsive to the performing, generating an N-bit digital output, and the N-bit analog-to-digital conversion including a conversion noise and a residual voltage;
amplifying a difference in the analog input voltage between two close time intervals by utilizing a preamplifier with a gain A;
sampling, after amplifying the difference in the analog input voltage between two close time intervals, the analog input voltage, by utilizing a noise-canceling circuit of the reconfigurable ADC;
responsive to the sampling after the amplifying, lowering the conversion noise, the conversion noise being inversely related to a mathematical squaring of the gain A;
responsive to the lowering of the conversion noise, increasing a first resolution of the first cycle of the N-bit analog-to-digital conversion;
adding or subtracting the residual voltage from the first cycle to a second cycle of the N-bit analog-to-digital conversion by utilizing a noise-shaping circuit of the reconfigurable ADC; and
responsive to the adding or subtracting, increasing a second resolution of the second cycle of the N-bit analog-to-digital conversion, the reconfigurable ADC selectively supporting at least two different resolution settings by operating in one of at least two different modes of operation that comprise at least two of:
a first mode, the first mode utilizing the SAR ADC, the noise-canceling circuit, and the noise-shaping circuit;

a second mode, the second mode utilizing the SAR ADC and the noise-canceling circuit;

a third mode, the third mode utilizing the SAR ADC and the noise-canceling circuit; and a fourth mode, the fourth mode utilizing the SAR ADC.

13. The method of claim 12, wherein:

the at least two different resolution settings of the reconfigurable ADC are measured or calculated in effective number of bits (ENOBs).

14. The method of claim 13, wherein:

operating in the first mode comprises operating in a first phase, a second phase, a comparator phase, a first residual phase, and a second residual phase;

operating in the second mode comprises operating in the first phase, the second phase, and the comparator phase;

operating in the third mode comprises operating in the first phase, the second phase, and the comparator phase; and operating in the fourth mode comprises operating in first phase and the comparator phase.

15. The method of claim 14, wherein the reconfigurable ADC selectively supports the at least two different resolution settings by consuming at least two different amounts of power, supports at least two different bandwidths, and operates in at least two different sampling rates.

16. The method of claim 15, wherein:

the at least two different resolution settings include a first, a second, a third, and a fourth ENOB resolution, and wherein:

the first ENOB resolution is higher than the second ENOB resolution;

the second ENOB resolution is higher than the third ENOB resolution; and the third ENOB resolution is higher than the fourth ENOB resolution;

the at least two different amounts of power include a first, a second, a third, and a fourth amount of power, and wherein:

the first amount of power is higher than the second amount of power;

the second amount of power is higher than the third amount of power; and the third amount of power being is than the fourth amount of power;

the at least two different bandwidths include a first and a second bandwidth, and wherein:

the first bandwidth is higher than the second bandwidth; and the at least two different sampling rates include a first and a second sampling rate, and wherein:

the first sampling rate is considerably larger than a Nyquist rate; and the second sampling rate is approximately equal to the Nyquist rate.

17. The method of claim 16, wherein the reconfigurable ADC selectively operates in:

the first mode, the first mode supporting the first ENOB resolution, consuming the first amount of power, supporting the first bandwidth, and operating in the first sampling rate;

the second mode, the second mode supporting the second ENOB resolution, consuming the second amount of power, supporting the first bandwidth, and operating in the first sampling rate;

the third mode, the third mode supporting the third ENOB resolution, consuming the third amount of power, supporting the first bandwidth, and operating in the second sampling rate; and the fourth mode, the fourth mode supporting the fourth ENOB resolution, consuming the fourth amount of power, supporting the second bandwidth, and operating in the second sampling rate.

18. The apparatus of claim 1, wherein:

lowering the conversion noise increases the resolution of the at least two different resolution settings of the reconfigurable ADC; and adding or subtracting the first residual voltage from the first cycle to the second cycle of the N-bit analog-to-digital conversion increases the resolution of the at least two different resolution settings of the reconfigurable ADC.

19. The method of claim 12, further comprising:

operating in the first mode by operating the reconfigurable ADC in a first phase, a second phase, a comparator phase, a first residual phase, and a second residual phase;

operating in the second mode by operating the reconfigurable ADC in the first phase, the second phase, and the comparator phase;

operating in the third mode by operating the reconfigurable ADC in the first phase, the second phase, and the comparator phase; or operating in the fourth mode by operating the reconfigurable ADC in first phase and the comparator phase.

20. The method of claim 12, wherein the reconfigurable ADC is configured to selectively support the at least two different resolution settings by consuming at least two different amounts of power, supporting at least two different bandwidths, or operating in at least two different sampling rates.

* * * * *